United States Patent [19]

Matthews

[11] Patent Number: 5,600,247
[45] Date of Patent: Feb. 4, 1997

[54] DYNAMICALLY BALANCED FULLY DIFFERENTIAL CIRCUIT FOR USE WITH A BATTERY MONITORING CIRCUIT

[75] Inventor: Wallace E. Matthews, Richardson, Tex.

[73] Assignee: Benchmarq Microelectronics, Dallas, Tex.

[21] Appl. No.: 291,688

[22] Filed: Aug. 17, 1994

Related U.S. Application Data

[63] Continuation-in-part of Ser. No. 910,675, Jul. 8, 1992, abandoned.

[51] Int. Cl.$^6$ .................................................. G01N 27/416
[52] U.S. Cl. ............................. 324/426; 320/48; 340/636
[58] Field of Search .............................. 324/426, 427, 324/428, 431, 433, 436; 320/48; 340/636

[56] References Cited

U.S. PATENT DOCUMENTS

| | | | |
|---|---|---|---|
| 4,820,966 | 4/1989 | Fridman | 324/434 |
| 5,179,340 | 1/1993 | Rogers | 324/426 |
| 5,254,952 | 10/1993 | Salley et al. | 324/426 |
| 5,284,719 | 2/1994 | Landau et al. | 324/427 |
| 5,357,203 | 10/1994 | Landau et al. | 324/427 |
| 5,454,710 | 10/1995 | Landau et al. | 324/427 X |

*Primary Examiner*—Kenneth A. Wieder
*Assistant Examiner*—Glenn W. Brown
*Attorney, Agent, or Firm*—Gregory M. Howison

[57] ABSTRACT

A battery detect circuit (32) is provided that is operable to dispose a sense resistor (50) in series with the battery to determine whether the charge is being provided to the battery or being extracted from the battery. The voltage across the sensor resistor (50) is sensed by a voltage/frequency converter (52). The voltage/frequency converter (52) is a differential structure comprised of two integrator structures (102) and (104) that are operable to utilize a switched capacitor configuration to drive comparators on the output thereof. Each of the integrator structures (102) and (104) has associated therewith passive elements and active elements. The integrators (102) and (104) have associated therewith integration capacitors (147) and (149). Additionally, there are two operational amplifiers (143) and (145) that provide the active components of each of the integrators (102) and (104). The various switched capacitor circuits (161) and (163) associated with the amplifiers (143) and (145) are provided to provide the integration operation. Both the amplifiers (143) and (145) and their associated switched capacitor circuits (161) and (163) are dynamically balanced such that they are switched between integrator (102) and integrator (104) on a periodic basis. This therefore allows the errors between the active and passive elements to be switched between the two integrators (102) and (104) such that no accumulative error occurs.

2 Claims, 9 Drawing Sheets

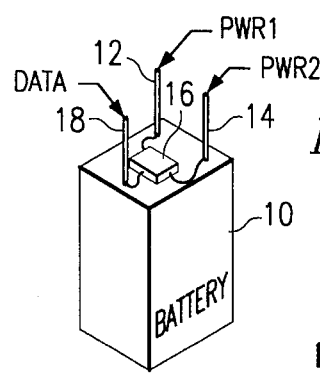
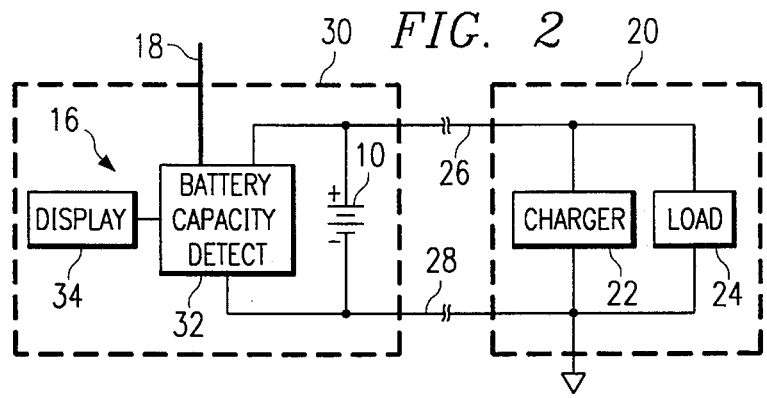
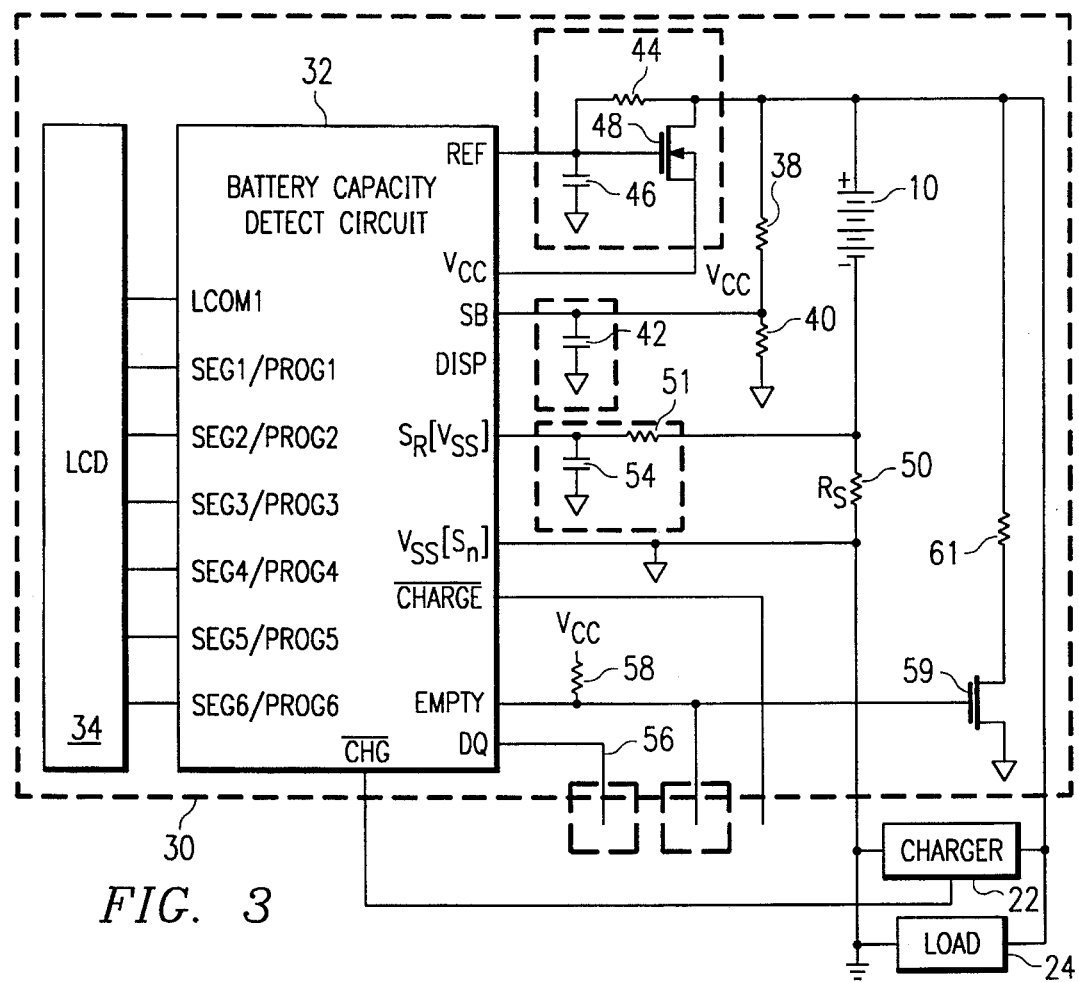

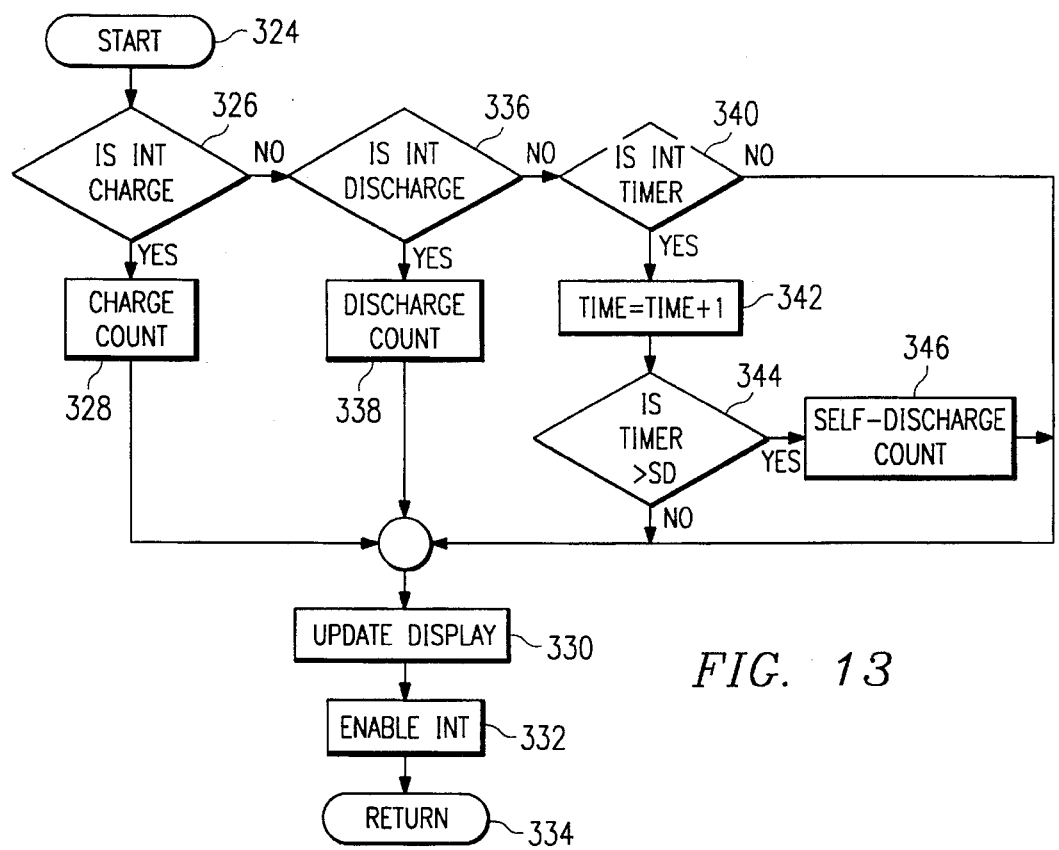
FIG. 13
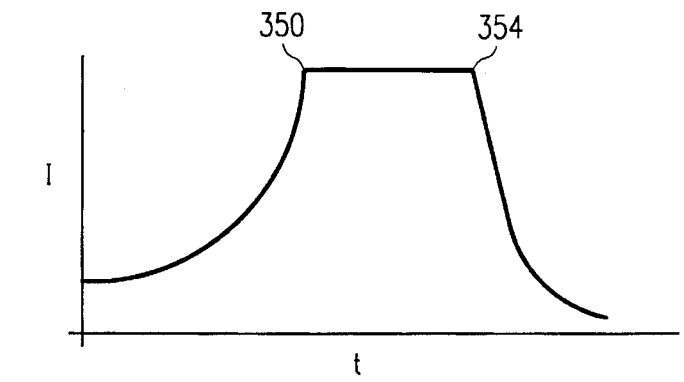
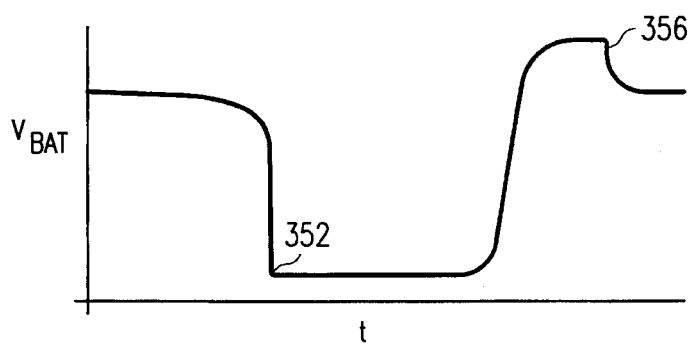
FIG. 14

5,600,247

DYNAMICALLY BALANCED FULLY DIFFERENTIAL CIRCUIT FOR USE WITH A BATTERY MONITORING CIRCUIT

CROSS-REFERENCE TO RELATED APPLICATIONS

This application is a Continuation-in-Part application of U. S. patent application Ser. No. 910,675, filed Jul. 8, 1992, and entitled, "Method and Apparatus for Monitoring Battery Capacity Under Fast Discharge Conditions" (Atty. Dkt. No. BENC-19,786), now abandoned, and is related to U.S. patent application Ser. No. 910,687, filed Jul. 8, 1992 (Atty. Dkt. No. BENC-19,821), entitled "Method and Apparatus for Monitoring Battery Capacity", now U.S. Pat. No. 5,284,719, and U.S. patent application Ser. No. 910,688, filed Jul. 8, 1992 (Atty. Dkt. No. BENC-21,168), entitled "Method and Apparatus for Monitoring Battery Capacity with Charge Control", now U.S. Pat. No. 5,440,221.

TECHNICAL FIELD OF THE INVENTION

The present invention pertains in general to differential circuits and, more particularly, to a non-calibrated differential circuit for sensing a small DC voltage for the purpose of monitoring charge input to a battery.

BACKGROUND OF THE INVENTION

With the advent of portable electronic systems for personal and business use, rechargeable batteries have seen an increased and widespread use. One problem that has risen with respect to rechargeable batteries has been the length of time that a battery can be used after it has been charged. Although manufacturers rate a battery for a given portable computer or battery operated device as to the number of hours that it will operate, the actual operating time is a function of a number of parameters. For example, personal computers provide a variable load which is a function of the peripheral devices that are activated, such as the screen, the hard disk, etc., such that the operating life of the battery will vary as a function of how often these peripheral devices are used. Power consumption by the peripherals has conventionally been reduced by utilizing increasingly sophisticated power management tools to minimize the amount of power that is drained from the battery, thus extending the operating time of the battery for a given charge. Another problem encountered with rechargeable batteries is partial charging. The manufacturer's specifications are directed toward a relatively new battery with a "full" charge. If, for some reason, the battery does not have a full charge, the user has no knowledge of how much operating time he has on a particular battery. Since rechargeable batteries typically have a relatively flat voltage over their charge life, very little warning is typically available as to when the battery is nearing its end of discharge. Further, the condition of a battery, i.e. , its age, etc., also affects the amount of charge that can be stored in a given battery. This could result in a fully charged battery driving the battery operated device for a shorter period of time than expected.

Battery-pack systems have been developed to provide information regarding the condition of the battery, the state of charge of the battery, etc., with these devices integrated into the battery-pack itself. Such a device is disclosed in U.S. Pat. No. 4,289,836, issued to Lemelson on Sep. 15, 1981. These battery-pack systems have been utilized with the battery to both condition the battery and provide some information as to the amount of charge that is in the battery, i.e., a measure of its capacity. These conditioning systems typically monitor and control the charging operation to determine when the voltage has reached a state that represents a full charge. Periodically, the battery is completely discharged for conditioning purposes. The capacity is learned by measuring the charge supplied to the battery from a condition where the battery is at its end of discharge voltage, and is charged to a full voltage. This charge monitoring circuitry is typically a device that measures current through a known resistive value and calculates charge therefrom.

One disadvantage to the present battery-pack systems is that in order to make some determination as to capacity, it is necessary for the charging operation to be an integral part of the capacity determining operation. However, systems having a totally self-contained charging unit that is separated from the battery have no way of storing capacity information with the battery after it is disconnected. As such, such systems do not provide battery capacity information.

Another disadvantage to battery pack systems is the use thereof with high current devices such as power tools. When a power tool is run under full load, charge removed from the battery increases to a very high level such that the voltage of the battery drops due to the voltage drop across the internal resistance of the battery. Since this voltage is utilized to determine various characteristics of the battery, determining the charge state thereof, etc., a high current condition can result in error. Further, a high current mode is typically followed by a zero current mode, wherein the battery again returns to its full voltage, even though the overall condition of the battery has deteriorated. Present systems do not account for a situation wherein current goes from a normal load level to a high load level.

One aspect of most battery monitoring systems is the requirement to monitor either a charging operation or a discharging operation. This is typically effected by placing a sense resistor in series with the current provided to the battery or taken from the battery. The voltage developed across the battery is then sensed and converted into a current value. This is done through some type of analog-to-digital converter. However, due to the loss provided by the sense resistor, the sense resistor value is typically very small, such that the voltage across the resistor that is developed is also relatively small. To provide an adequate resolution, a very sensitive sensing device is required. Since the sensing device must deal with very small voltage changes, they typically will be subject to various offsets and the such. A differential system is typically utilized to remove external influences from the sensing operation. However, these differential circuits themselves have inherent imbalances which must be compensated for. In the past, these imbalances within the differential circuit have been accounted for by providing some type of offset cancellation operation. However, this provides an additional level of complexity.

SUMMARY OF THE INVENTION

The present invention disclosed and claimed herein comprises a battery monitoring circuit for monitoring current through a sense resistor disposed in series with one terminal of the battery by detecting the voltage across the sense resistor. The structure for sensing the voltage across the sense resistor utilizes a voltage/frequency converter that converts the voltage to a pulse stream. The rate of the pulse stream corresponds to the voltage across the sense resistor and, therefore, the current through the sense resistor. A circuit then determines the current through the sense resistor and the polarity thereof. The voltage/frequency converter has a differential structure associated therewith with first and second differential legs. The first differential leg has associated therewith passive switching elements and active elements and is operable to receive an input voltage and output a first differential signal. The second differential leg has associated therewith passive switching elements and active elements and is operable to receive the input voltage and output a second differential signal. The input voltage to the second differential leg is the voltage across the sense resistor. Multiplex circuitry is operable to periodically switch the passive switching elements and active elements in the first and second differential legs to the opposite of the first and second differential legs to provide balancing of inherent errors in the active elements and the passive switching elements.

In another aspect of the present invention, each of the first and second differential legs has associated therewith an input switched capacitor integrator. The switched capacitor integrator in the first differential leg has a first integrator feedback capacitor associated therewith and first switched control signals. Similarly, the switched capacitor integrated with the second differential leg has associated therewith a second integrator feedback capacitor and second switched control signals. A first switchable amplifier is provided that has associated therewith a switched capacitor input structure which, when the first switchable amplifier has the first or second integrator feedback capacitor connected between the input and output of the first switchable amplifier and the associated switched capacitor input structure controlled by the first or second switched control signals, it will form the respective one of the first or second switched capacitor integrators. Similarly, a second switchable amplifier is provided with an associated switched capacitor input structure. When the second switchable amplifier is configured with the first or second feedback capacitor connected across the amplifier and the associated switched capacitor input structure controlled by the respective first or second switched control signals, it will form the other of the respective first or second switched capacitive integrators. A multiplexer is provided that is operable to alternatively switch the first and second switchable amplifiers between the first and second differential legs.

BRIEF DESCRIPTION OF THE DRAWINGS

For a more complete understanding of the present invention and the advantages thereof, reference is now made to the following description taken in conjunction with the accompanying Drawings in which:

FIG. 1 illustrates a perspective view of a battery-pack system;

FIG. 2 illustrates a diagrammatic view of the isolated battery capacity detect circuit and charger;

FIG. 3 illustrates a chip level block diagram of the battery capacity detect circuit;

FIG. 13 illustrates a flowchart for handling the interrupt; and

FIG. 14 illustrates a diagram of current and voltage as a function of time for a fast-discharge condition.

DETAILED DESCRIPTION OF THE INVENTION

Figure 4:
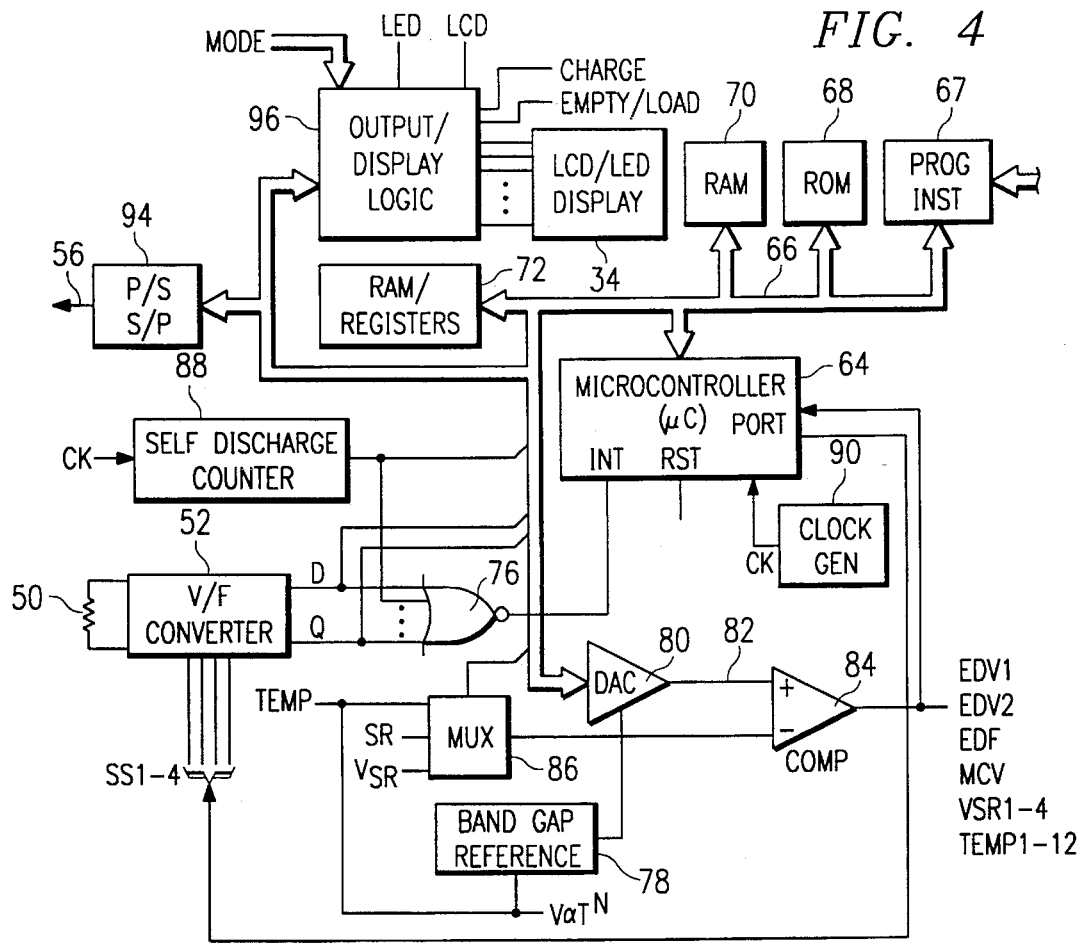
FIG. 4 illustrates a logic block diagram of the battery capacity detect circuit.

Referring now to FIG. 1, there is illustrated a perspective view of a battery-pack. In general, the battery-pack is comprised of a battery 10 having power terminals 12 and 14 labeled PWR 1 and PWR 2, respectively. The power terminals 12 and 14 are operable to receive the two polarities of the battery. Connected to the two terminals of batteries 12 and 14 is the battery monitoring circuit 16. The battery monitoring circuit 16 is connected to a third terminal 18 that is operable to allow data to be transferred to and from the battery monitoring circuit 16, as will be described hereinbelow.

Referring now to FIG. 2, there is illustrated an interconnection diagram for the overall charging and monitoring operation. The battery charger is disposed in an isolated housing 20 which is comprised of a battery charger 22 and a load 24, the load 24 being provided in the event that the charger is disconnected from the battery. Two wires 26 and 28 are connected to opposite sides of the charger to carry the charging current therefrom. These extend external to the overall housing 20. They are connected to a battery-pack 30 that houses the battery 10 and the battery monitoring circuit 16. The battery monitoring circuit 16 is comprised of a battery capacity detect circuit 32 and a display 34. The battery capacity detect circuit 32 interfaces with the terminal 18 to allow data communication therewith. The battery charger 22 is operable to monitor and control the charging operation. In the charging operation, a current is typically applied to the battery terminals 10 until a predefined charge termination condition is reached, at which time the charging current is disabled and/or the current is reduced to a trickle charge level. The charger 22 further can have modes of operation wherein the current is delivered at different rates, it is pulsed, etc. These are well-known techniques for effectively charging the battery 10. Further, circuitry can be provided for periodically conditioning the battery 10 by fully discharging and then charging it all the way to full state of charge. However, it can be seen that since the battery-pack 30 and the charger 22 are isolated and disconnectable, any information regarding the battery must be contained within the battery-pack 30.

Referring now to FIG. 3, there is illustrated a chip level block diagram of the battery capacity detect circuit 32 and the display 34, illustrating the peripheral circuitry that is connected to the battery capacity detect circuit. The battery 10 has the positive terminal thereof connected to one side of a resistive divider comprised of resistors 38 and 40 with the common connection between resistors 38 and 40 connected to the SB-input of the detect circuit 32. A capacitor 42 is provided for noise filtering purposes. The other side of the resistor divider is connected to ground. This basically provides a divided voltage from the battery full potential. The positive terminal of battery 10 is also connected to one side of a resistor 44, the other side of which is connected to a reference input. A filter capacitor 46 is connected between the reference input and ground. The reference terminal is also connected to the gate of a field effect transistor 48, the source/drain path thereof connected between the positive terminal of the battery 10 and the $V_{cc}$ input of the detect circuit 32. A reference voltage output of the detect circuit 32 provides a control voltage to the transistor 48 to regulate the voltage $V_{cc}$ from the battery terminal 10.

A sense resistor 50 is provided, having a value of approximately 0.1 Ohms to 0.02 Ohms. One side of sense resistor 50 is connected to the negative terminal of battery 10, and the other side of sense resistor 50 is connected to ground. The negative terminal of battery 10 is also connected through a resistor 51 to the sense resistor input terminal $S_R$. A filter capacitor 54 is connected between the $S_R$ terminal and ground.

A serial input/output DQ is provided for allowing serial communication with a serial bus 56. The serial bus 56 communicates with the data lead 18. Another output, EMPTY provides a status output. A pull up resistor 58 is connected between the EMPTY output and $V_{cc}$. The EMPTY terminal is essentially a status output that provides at least one status signal, that indicating when an End of Discharge Voltage value has been reached for the battery 10. However, multiple status signals could be output with the use of internal multiplexing functions.

The display 34 is illustrated as being a Liquid Crystal Display (LCD). The LCD display 34 has five segments that are connected to six segment outputs and a common output. However, it should be understood that an LED display could also be utilized.

The EMPTY output of the battery capacity detect circuit 32 is connected to the gate of an FET 59, the drain thereof connected to ground and the source thereof connected through a resistor 61 to the positive terminal of the battery 10 which comprises the $V_{BAT}$ voltage. The FET 59 allows the battery capacity detect circuit 32 to place a load on the battery under certain conditions. As will be described hereinbelow, the load resistor 61 is disposed in parallel with the battery 10 after a condition wherein the battery undergoes a high discharge rate. This is typically a situation involving such things as power tools, wherein the full load is disposed across the battery 10. Typically, after the occurrence of such a condition, the load goes to zero. By allowing the FET 59 and the load 61 to be disposed across the battery 10, some minimal load can be placed on the battery to insure that any measurements taken thereafter are correct. This is due to the fact that a relatively weak battery under no load will exhibit a voltage that is typically at full cell voltage.

Referring now to FIG. 4, there is illustrated a block diagram of the battery capacity detect circuit 32. The overall operation of the system is controlled by a central microcontroller 64. The microcontroller 64 is operable to interface through an address/data bus 66 with a Program Instruction block 67, a Read Only Memory (ROM) 68, in which program instructions are stored. A Random Access Memory (RAM) 70 is also provided and is interfaced with the address/data bus 66. The microcontroller 64 is also interfaced through the address/data bus 66 with a dual port RAM/register combination 72. The bus 66 is essentially comprised of a plurality of data lines, address lines and control lines. The dual port RAM/register combination 72 allows the peripheral circuitry associated with the microcontroller 64 to communicate therewith through buffers for setting flags, storing data words, etc. Further, the microcontroller 64 can also store commands in the various registers for output to the various peripheral circuits.

The sense resistor 50 is connected on either end thereof to the input of a voltage/frequency (V/F) converter 52 which is operable to convert the voltage to a variable pulse output. Two outputs are provided, a D-output and a Q-output. These are interrupts which are input to a multi-input NOR gate 76. The output of the NOR gate 76 is connected to the interrupt input on the microcontroller 64. Additionally, the D-output and the Q-output are connected to the bus 66 for interconnection with the dual port RAM/register combination 72. As will be described hereinbelow, the V/F converter 52 is operable to generate a pulse stream on the Q-output representing a charging operation, wherein a pulse stream on the D-output represents a discharge operation. The frequency of the pulses represents the relative discharge/charge rate, with a higher frequency indicating a higher discharge/charge rate and lower frequency representing a lower discharge/charge rate.

A band gap reference circuit 78 is provided for generating a reference voltage. The band gap reference voltage is a conventional type of circuit, the reference voltage output being utilized primarily for the input to a Digital-to-Analog Converter (DAC) 80 and the V/F converter 52. The DAC 80 has digital input thereof connected to the bus 66 to receive a data word therefrom. The data word represents a voltage level, which voltage level is generated by the microcontroller 64. This is converted to an analog voltage on an output line 82 for input to the positive input of a comparator 84 as the reference voltage. The negative input of the comparator 84 is connected to the output of a multiplexer 86. The multiplexer 86 is operable to select one of the multiple input voltages for input to the negative input of the comparator 84. The multiplexer 86 primarily receives the voltage output of the sense resistor $V_{SR}$ and the SB-input, which represents the divided down potential of the battery. Further, a TEMP signal is input to the multiplexer 86, which TEMP signal represents a temperature variable voltage that is generated in the band gap reference circuit 78 and provides an indication of temperature.

The band gap reference circuit 78 is operable to generate internal voltages that are not temperature compensated. These voltages are then combined to provide a compensated output to the DAC 80. One of the internal uncompensated voltages provides the TEMP input to the multiplexer 86. The multiplexer 86 is controlled by a control signal received from the bus 66.

The comparator 84 is operable to output a number of signals that indicate when the comparator threshold has been bypassed. These are the End of Voltage signals, EDV-1, EDV-2 and EDF, EDV-1 and EDV-2 comprising early warning signals as to when the battery is nearing its End of Voltage and the EDF signal providing a final End of Voltage signal. An MCV signal is output which represents the maximum cell voltage and four voltages VSR-1, VSR-2, VSR-3 and VSR-4 are also output indicating four separate values of voltage on the sense resistor, indicating magnitude of discharge. Voltages TEMP1–TEMP12 are also output to represent various temperature thresholds. The various outputs are generated by changing the digital output of the DAC 80 and then a self-discharge counter 88 provides a separate counting operation that is utilized to generate information as to the period of time that has passed since the battery has been charged. The self-discharge counter 88 is clocked by a clock signal generated by a clock generator 90, which clock generator 90 also provides a clock signal to the microcontroller 64 and the remaining circuitry. The self-discharge counter 88 is essentially a free running counter that outputs pulses with a given periodicity. As will be described hereinbelow, these pulses are utilized to increment an internal software discharge counter in order to account for self-discharge of the battery 10.

A parallel/serial serial/parallel converter 94 is provided for interfacing between the bus 66 and the serial communication line 56. The converter 94 allows communication between the bus 66 and the dual port RAM/register combination 72, with the serial bus 56 allowing information to be transferred from the serial bus 56 to the dual port RAM/register combination 72 and from the dual port RAM/register combination 72 to the serial bus 56. Further, other signals are also transferred thereto.

The bus 66 is interfaced with a display logic block 96 which interfaces with the display 34. The display 34, as described above, can either be an LCD or an LED display. The display logic block 96 can select either type of display.

The first two program pins PROG1 and PROG2 are the programmed full count inputs. Upon initialization, the microcontroller 64 reads the PROG1 and PROG2 inputs as three-level input pins, which may be resistively tied to $V_{cc}$ or $V_{SS}$ if the display is enabled, tied directly if the display is disabled, or left floating in either case. The input states define the programmed full count thresholds 1–9 as defined in the PFC column of Table 1, or readable as an independent data input if the programmed full count threshold is defined in the ROM 68. The nine PFC thresholds are each spaced approximately 10% from another.

input results in a $1/80$ mVH; for a floating input, $1/160$ mVH; and for a low input, $1/320$ mVH. This provides the mVH per available charge value counter unit, which will also be described hereinbelow.

The PROG4 and PROG5 pins provide a three-function selection input. Upon power up, the pins are read as three-level input pins to define the scale factor multiplier, self-discharge rate selection, and discharge compensation enable/disable. These pins are readable as an independent data input to the extent that any one to all three can be defined in ROM. The pin functions are described in Table 2.

TABLE 2

| ProgX | | Scale Factor | Self-discharge | Discharge |
|---|---|---|---|---|
| 4 | 5 | multiplier | nominal rate | compensation |
| Z | Z | 1 | $1/30.5$C | Enabled |
| Z | L | 1 | $1/61$C | Enabled |
| Z | H | 1 | $1/30.5$C | Disabled |
| L | Z | 1 | $1/61$C | Disabled |
| L | L | ⅛ | $1/30.5$C | Enabled |
| L | H | ⅛ | $1/61$C | Enabled |
| H | Z | ⅛ | $1/30.5$C | Disabled |
| H | L | ⅛ | $1/61$C | Disabled |
| H | H | NA | NA | NA |

The PROG6 pin is a display mode selection pin that, upon power up initialization, defines the display mode, or is readable as an independent data input from ROM. As a display input, a floating input indicates that the display is to operate in an "absolute full reference operation" mode wherein a 100% full level is equal to the Program Full Count (PFC). It is noted that this function or mode allows for greater than the 100% full indication to be provided. When the PROG6 pin is low, this indicates a mode for "relative full reference operation", wherein a 100% full level on the display is set equal to the last measured capacity. In this mode, the display will indicate a level having as a reference the last determined capacity of the battery. In this mode, an

TABLE 1

| | | Programmed Full Count mVH selections | | | | | | | | |
|---|---|---|---|---|---|---|---|---|---|---|
| Progx | PFC | | | | | | | | | |
| |—Prog⅖=1X—| |—Prog⅖=(⅛)X—| <—[bq$^{2010}$/12]| | | | | | | | | |
| [bq$^{2011}$/13]—>|—Prog⅘=1X—| |—Prog⅘=(⅛)X—| | | | | | | | | |
| 1 | 2 | full count | $1/80$ | $1/160$ | $1/320$ | $1/640$ | $1/1280$ | $1/2560$ | $1/5120$ | CODE |
| H | H | 49152 | 614 | 307 | 154 | 76.8 | 38.4 | 19.2 | 9.6 | 11000000 |
| H | Z | 45056 | 563 | 282 | 141 | 70.4 | 35.2 | 17.6 | 8.8 | 10110000 |
| H | L | 40960 | 512 | 256 | 128 | 64.0 | 32.0 | 16.0 | 8.0 | 10100000 |
| Z | H | 36864 | 461 | 230 | 115 | 57.6 | 28.8 | 14.4 | 7.2 | 10010000 |
| Z | Z | 33792 | 422 | 211 | 106 | 53.0 | 26.4 | 13.2 | 6.6 | 10000100 |
| Z | L | 30720 | 384 | 192 | 96.0 | 48.0 | 24.0 | 12.0 | 6.0 | 01111000 |
| L | H | 27648 | 346 | 173 | 86.4 | 43.2 | 21.6 | 10.8 | 5.4 | 01101100 |
| L | Z | 25600 | 320 | 160 | 80.0 | 40.0 | 20.0 | 10.0 | 5.0 | 01100100 |
| L | L | 22528 | 282 | 141 | 70.4 | 35.2 | 17.6 | 8.8 | 4.4 | 01011000 |

The PROG3 pin is a scale selection input. Upon power up initialization, the microcontroller 64 reads the PROG3 pin as a three-level input pin similar to the PROG1 and PROG2 pins. The input state defines a scale factor which is preset, or an independent data input can be provided to select a value stored in the ROM. The prestored scale factors are selected in three scales 1×, 2×, or 4×. These are utilized together with the scale factor multiplier specified by the PROG4 and PROG5 pins, as will be described hereinbelow, to select among the mVH/count scales which, for a high aging battery with a reduced capacity would be accommodated, wherein a "full" indication display would represent the maximum charge that the battery could contain. In the first mode, that indicated with a floating input on the PROG6 pin, an aging battery would never reach the "full" display level.

The EDV threshold voltages, EDV1, EDV2 and EDVF correspond to the first, second and final empty warning. Typical voltages are 0.95, 1.0 and 1.05, respectively. The VSR 1–4 threshold voltages provide for discharge compensation and these thresholds are 75 mv, 150 mv, 206 mv and 300 mv, respectively, the last, VSR 4, providing a value indicative of an overload. The MCV threshold relates to the maximum single-cell voltage which is set in the preferred embodiment to 1.8 volts over a range of from 10°–50° C. The temperature voltage thresholds TEMP1–12 correspond to twelve temperatures ranging from −30° C. to 80° C. in ten degree increments.

With respect to the EDV thresholds, an associated flag will be latched and remain latched, independent of the voltage on the SB input, until the next valid charge or, if the EDV state is latched at a temperature of less than 0°, until the temperature increases above 10° C. Valid EDV states are used in internal decisions and may be presented on the display and may be read out over the serial port. EDV monitoring will be disabled if $V_{SR}$ is greater than or equal to the EDV discharge compensation thresholds or the overload threshold. EDV monitoring will resume when the $V_{SR}$ drops back below the $V_{SR}$ threshold after a suitable stabilization period. The EMPTY output provides a latched indicator of an "empty" battery when the battery voltage falls below the EDV threshold which has been selected. Whenever the voltage on the SB input is greater than or equal to the MCV threshold, an indication is provided on the CHG output, which output can be then sent to the charger. If the voltage on the SB input falls below 0.1 volt, this is recognized as a "battery removed" condition.

Figure 5:
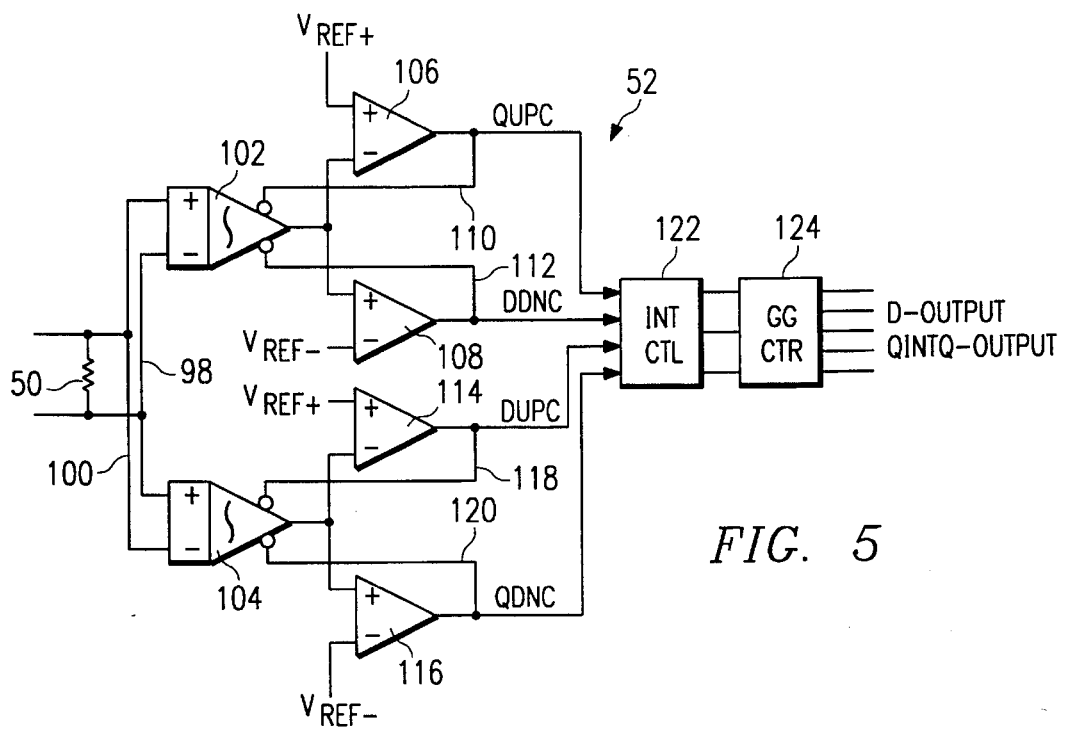
FIG. 5 illustrates a logic block diagram of the voltage/frequency converter.

Referring now to FIG. 5, there is illustrated a logic diagram of the voltage/frequency converter 52 of FIG. 4. The sense resistor 50 is connected across two input lines 98 and 100. Two integrators 102 and 104 are provided, with one integrator 102 providing an integration voltage that increases as voltage increases and the other integrator 104 providing an integration output that decreases as voltage increases. The lines 98 and 100 are connected to opposite inputs on both integrators 102 and 104. The integrator 102 has the output thereof connected to the negative input of a comparator 106 and to the positive input of a comparator 108. The positive input of comparator 106 is connected to a positive reference voltage and the negative input of comparator 108 is connected to a negative reference voltage. The positive reference voltage is at a voltage of approximately 1.2 volts and the negative reference voltage is at a voltage of approximately 0.6 volts. The output of comparator 106 provides an output QUPC that indicates an up charge count, whereas the output of the comparator 108 provides an output DDNC that represents a down discharge count operation.

The output of the integrator 102 is a ramp voltage that increases as the voltage increases such that when it is above the negative reference voltage, the output of the comparator 108 will be high, and when it is below the positive reference voltage, the output of comparator 106 is also high. When the voltage rises above the positive reference voltage, the output of comparator 106 goes low, and resets the integrator 102 through a line 110 to a voltage that is approximately 400 millivolts lower. This will result in the output of comparator 106 again going high, resulting in a pulse. The output of the integrator 102 will then again increase to above the positive reference voltage, assuming that the voltage across the sense resistor 50 is still high, until the output of comparator 106 again goes low. This results in a pulse stream on the output thereof having a frequency that is a function of the voltage across the sense resistor 50. During a discharge operation, the voltage polarity on sense resistor 50 will be reversed and integrator 102 will have a negative going ramp. When the negative going ramp falls below 0.6 volts, the voltage of the negative reference voltage, the output of comparator 108 will go low, inputting a reset signal to the comparator 102 through a reset line 112 to raise the voltage approximately 400 millivolts. If the discharge continues, a stream of pulses will be present on the output of comparator 108 indicating a discharge operation.

The output of integrator 104 is connected to the negative input of a comparator 114, the positive input of which is connected to the positive reference voltage. The output of integrator 104 is also connected to the positive input of a comparator 116, the negative input of which is connected to the negative reference voltage. The output of comparator 114 is connected to a reset input of the integrator 104 through a reset line 118 and the output of comparator 116 is connected to a reset input of the integrator 104 through a reset line 120. The integrator 104 provides a negative going ramp for a positive voltage and a positive going ramp for a negative voltage. Therefore, for a positive voltage, the comparator 116 will change states when the output of integrator 104 goes below the negative reference voltage and will be reset higher by 400 millivolts through the line 120. This will result in a pulse stream on the output thereof. Similarly, when a negative voltage is present, a pulse stream will result on the output of the comparator 114.

The outputs of the comparators 106 and 108 and the comparators 114 and 116 are input to an Integrator Control Circuit (INTCTL) 122, which is operable to compare the two outputs QUPC and QDNC and the outputs DDNC and DUPC to account for offsets in the integrators 102 and 104. Since integrators 102 and 104 are identical, the offsets will cancel each other. The pulse streams are phased such that they will not overlap, such that the pulse stream that is output by the combination, which is the function of ORing the two pulse streams together, will be the offset error-free pulse stream. The integrator control circuit 122 then generates three signals: one output which is high only when the charge count is present, indicating a charge; one output which is high when only the discharge count is present, indicating a discharge; and one output which is high when both the charge count and discharge count are present, indicating both states present. This therefore represents three separate states. These three separate states are input to a state machine which is comprised of a three-state counter 124 that generates the D-output and the Q-output. These are then input to the NOR gate 76 for input to the interrupt input of the microcontroller 64.

Figure 6:
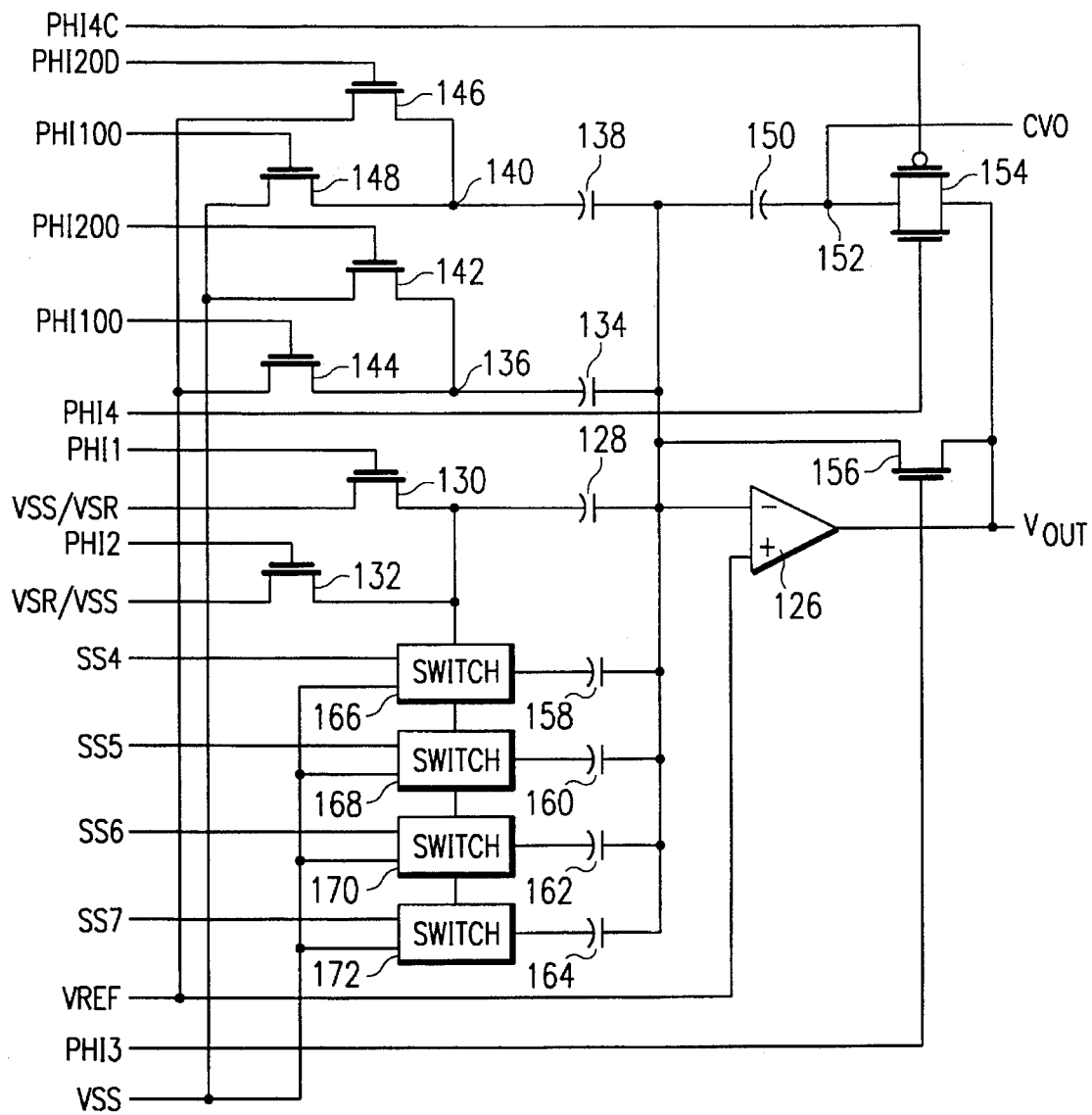
FIG. 6 illustrates a logic block diagram of the integrator.

Referring now to FIG. 6, there is illustrated a detailed logic diagram of each of the integrators 102 and 104. An operational amplifier 126 is provided having the negative input connected to the positive side of a capacitor 128 and the positive input thereof connected to a voltage $V_{REF}$. The other side of the capacitor 128 is connected to one side of the source/drain path of a transistor 130, and also to one side of the source/drain path of a transistor 132. The other side of the source/drain path of transistor 130 is connected to an input signal $V_{SR}/V_{SS}$ and the other side of the source/drain path of transistor 132 is connected to an input voltage $V_{SS}/V_{SR}$. Since the sense resistor 50 is connected between the $V_{SR}$ and $V_{SS}$ inputs, the integrator will provide a positive integration ramp as a function of current when the input to transistor 132 is greater than the input to transistor 130. The gates of transistors 130 and 132 are connected to two clock signals for controlling the operation thereof to alternately dispose the negative plate of capacitor 128 at either of the two voltages. This is essentially a switched-capacitor operation.

A first reset capacitor 134 has a positive plate thereof connected to the negative input of the op amp 126 and the negative input thereof connected to a node 136. A second reset capacitor 138 has the positive input thereof connected to the negative input of the op amp 126 and the negative plate thereof connected to a node 140. Node 136 is connected through the source/drain path of a transistor 142 to $V_{SS}$, and also through the source/drain path of a transistor 144 to the voltage $V_{REF}$. Similarly, the node 140 is connected through the source/drain path of a transistor 146 to $V_{REF}$, and also through the source/drain path of a transistor 148 to $V_{SS}$. The gates of transistors 142 and 144 are controlled by reset clocks to switch the bottom plate of the capacitor 134 between $V_{SS}$ and $V_{REF}$ and, similarly, the gates of transistors 146 and 148 are controlled by reset clock signals to switch the negative plate of the capacitor 138 between $V_{SS}$ and $V_{REF}$. One of the capacitors 134 and 138 is controlled such that it is charged to $V_{REF}$, and then switched to $V_{SS}$ during a reset operation to place a negative voltage on the input to the op amp 126. The other of the two capacitors 134 and 138 has the clock signals controlled such that the negative plate thereof resides at $V_{SS}$ during normal operation and is switched to $V_{REF}$ during a reset operation to provide a positive voltage change on the input to the op amp 126. These positive and negative voltage changes result in a corresponding positive and negative voltage change on the output of the op amp 126 of approximately 400 millivolts.

An integration capacitor 150 is connected between the negative input to the op amp 126 and a node 152. The node 152 is connected to one side of a transfer gate 154 comprised of a P-Channel transistor and an N-Channel transistor, the other side of the transfer gate 154 connected to the output of the op amp 126. The gates of the transistors in the transfer gate 154 are controlled by clock signals. A transistor 156 has a source/drain path connected between the negative input and the output of the op amp 126 to allow the offset of amplifier 126 to be sampled during the first phase of integration, the gate of transistor 156 controlled by a clock signal.

The rate of integration can be varied by selectively placing one of four capacitors 158, 160, 162 and 164 in parallel to capacitor 128. The capacitors 158–164 have the positive plates thereof connected to the negative input of the op amp 126 and the negative plates thereof connected to switched-capacitor circuits 166, 168, 170 and 172, respectively. Each of the switched-capacitor circuits 166–172 are connected to clock signals that allow the negative plate of the capacitors 158–164 to be connected in one cycle to the negative plate of capacitor 128 and, in another cycle, to $V_{SS}$.

Figure 6A:
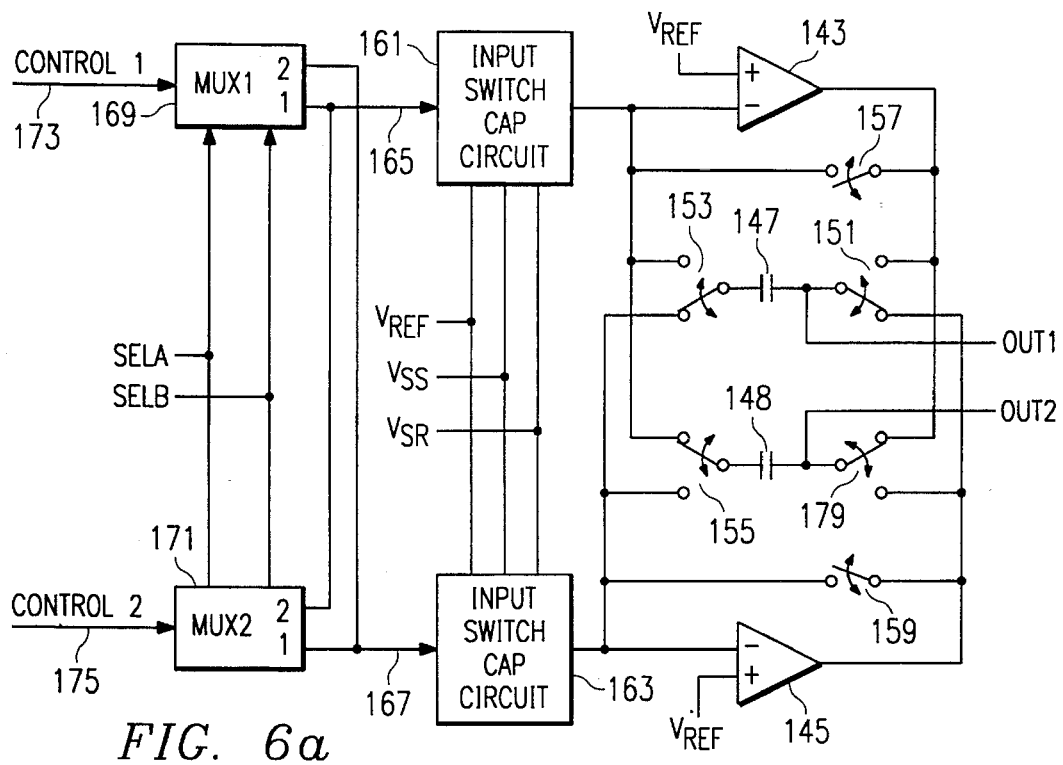
FIGS. 6a–6c illustrate an alternate embodiment of a dynamically balanced voltage/frequency converter utilizing the basic integrator structure of FIG. 6.

Referring now to FIG. 6a, there is illustrated an alternate embodiment of the present invention wherein each of the integrators illustrated in FIG. 6 comprises a dynamic element, outside of the feedback capacitor 150, wherein each of the amplifiers and their associated input structures are switched between the two integrators 102 and 104. Therefore, each of the outputs of the integrators 102 and 104 remains the same with the capacitive input structures and the active elements being switched between the two on a periodic basis, while maintaining the feedback capacitor 150 unswitched.

In FIG. 6a, there are illustrated two operational amplifiers, operational amplifier 143 and operational amplifier 145. Each of these operational amplifiers 143 and 145 correspond to the operational amplifier 126 in FIG. 6. There are provided for each of the integrators 102 and 104 feedback capacitors 147 and 149, it being remembered that the feedback capacitors 147 and 149 provide feedback structures for the integrators 102 and 104 and are similar to the feedback capacitor 150 illustrated in FIG. 6. These feedback capacitors 147 and 149 are the memory elements of the respective legs. The feedback capacitor 147 provides on one plate thereof the output OUT1 as the output of integrator 102, this plate of the capacitor also connected to the wiper of a switch 151. The capacitor 149 also has a plate thereof providing the output of the integrator 104, this labelled OUT2, this plate of capacitor 149 also connected to the wiper of a switch 179. Switch 151 has two poles, one pole connected to the output of the amplifier 143 and the other pole thereof connected to the output of amplifier 145. Similarly, switch 153 has two poles, one pole connected to the output of amplifier 143 and one pole connected to the output of amplifier 145. Therefore, the output plates of capacitors 147 and 149 can be connected to alternate ones of the outputs of amplifiers 143 and 145. The other plate of capacitor 147 is connected to the wiper arm of a switch 153 and the other plate of capacitor 149 is connected to the wiper arm of a switch 155. The switch 179 has two poles, one pole connected to the negative input of amplifier 143 and the other pole thereof to the negative input of the amplifier 145. Similarly, switch 155 has two poles, one pole thereof connected to the negative input of amplifier 143 and the other pole thereof connected to the negative input of the amplifier 145. As was illustrated in FIG. 6, the positive inputs of both amplifiers 143 and 145 are connected to the reference voltage $V_{REF}$. Each of the amplifiers 143 and 145 have a respective switch 157 and 159, connected between the negative input and the output, this being similar to the transistor switch 156 illustrated in FIG. 6. This is used for the purpose of zeroing the respective amplifier 143 or 145.

As was the case with the embodiment illustrated in FIG. 6, there are a plurality of switched capacitors connected to the negative input of each of the amplifiers 143 and 145. These are represented by input switched capacitor circuit 161 associated with amplifier 143 and input switched capacitor circuit 163 associated with amplifier 145. Each of the input switched capacitor circuits 161 and 163 is associated with the capacitors 128, 134, 138, 158, 160, 162 and 164, as illustrated in FIG. 6. Additionally, the various switching transistors associated with these transistors are also accounted for in the input switched capacitor circuits 161 and 163. As described in FIG. 6, each of the input switched capacitor circuits 161 and 163 in FIG. 6a has as inputs the voltages $V_{SS}$, $V_{SR}$ and $V_{REF}$. Additionally, the various control signals that clock the switches to the capacitors 128, 134 and 138 are also provided on clock input lines 165 for input switched capacitor circuit 161, and clock input lines 167 for input switched capacitor circuit 163. These are control signals that stay with capacitors 147 and 149. It is the input switched capacitor circuits 161 and 163 and the amplifiers 143 and 145 that are switched, i.e., the active elements and their passive components are switched.

A multiplexer 169 and a multiplexer 171 are provided, multiplexer 169 connected to the clock signals on a control input 173 associated with integrator 102, and the multiplexer 171 receiving on the input thereof the clock signals on a control input 175. The multiplexer 169 has two outputs, one connected to the clock line 165 and one connected to the clock line 167. Similarly, the multiplexer 171 has two outputs, one connected to the clock line 165 and one connected to the clock line 167. The multiplexers 169 and 171 are controlled by two select lines SELA and SELB. Select lines SELA and SELB are clocked at a rate that is such that any switching does not interfere with the switching operation of the switched capacitor circuits 161 and 163, the signal that drives SELA and SELB being at a fifty percent duty cycle.

During one cycle of the select operation, the multiplexers 169 and 171 select the first output such that the multiplexer 169 selects the first clock output connected to clock line 165 and multiplexer 171 selects the first clock output connected to clock line 167. On the second cycle, that associated with SELB, the multiplexer 169 selects the second output connected to clock line 167 and the multiplexer 171 connects the second output thereof connected to clock line 165. Similarly, during SELA, switch 151 and switch 153 are operated to connect capacitor 147 across the negative input and positive output of amplifier 143 and switches 179 and 155 are configured to switch capacitor 149 across the negative input and output of amplifier 145. On the next cycle, that associated with SELB, the switches 151 and 153 and switches 179 and 155 are configured to be disposed across amplifiers 145 and 143, respectively. As such, it can be seen that in one cycle of the operational amplifier 143 and the associated input switched capacitors 161 and the operational amplifier 145 and the input switched capacitor circuit 163 associated therewith are switched between integrators 102 and 104. The same control signals operate the system and are associated with integrators 102 and 104 at all times, as is the case with the associated integration capacitors 147 and 149.

The present implementation provides for a dynamically balanced differential structure that can be utilized for the integration operation of the voltage/frequency converter of the present invention. Generally, there are a number of practical limits that can be realized without some type of self-calibration. The typical operational amplifiers have finite gains, which can be low and cause errors to be propagated through the system. Additionally, each of the operational amplifiers has a finite input offset voltage that can be different between the two elements. There are also considerations such as charge injection effects from the MOS transistor switches. Depending on the exact circuit, any or all of these error sources can be significant. These have typically been accounted for by providing some type of calibration procedure. In the present invention, there is no calibration procedure, while allowing for a relatively low input voltage on the amplifier. In order to account for this, the errors are subtracted with the use of dynamic balancing. This is achieved not only by dynamically balancing the capacitive elements such as the capacitors, but also by applying the dynamic balancing technique to the active components, i.e., switching the actual operational amplifiers and switches themselves between the two differential links.

Figure 6B:
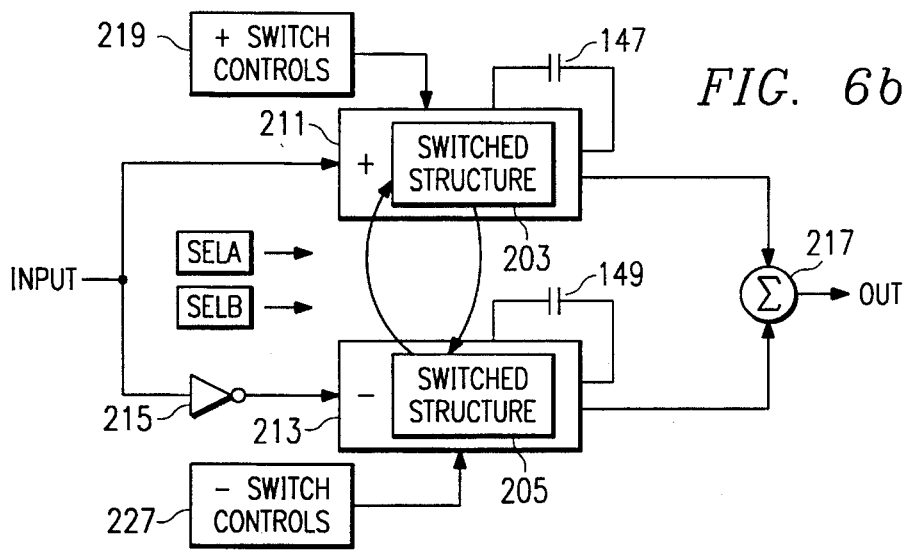

Referring now to FIG. 6b, there is illustrated an overall block diagram of the structure of FIG. 6a. The capacitors 147 and 149 comprise memory elements which must be maintained with the positive or negative leg of the differential structure. This is illustrated via a positive block 211 and a negative block 213 which are disposed in the positive and negative differential legs. The positive block 211 receives the positive input and the negative block 213 receives the negative input, which is the inverse of the positive input represented by passing the input through an inverter 215. The output of each of the switches at the blocks 211 and 213 is input to a summing device 217, the output thereof providing the output of the integrator structure. Switch structures 203 and 205 are provided in the positive and negative blocks, respectively. Switch structures 203 and 205 includes, respectively, both the switched capacitor blocks 161 and 163 illustrated in FIG. 6a, and also the active portion of the operational amplifiers 143 and 145. Each of the blocks 211 and 213 have associated therewith switch controls, a positive switch control block 219 associated with positive block 211 and a negative switch control block 221 associated with the negative block 213 for controlling the switched capacitor blocks 161 and 163, respectively.

During operation, the switched structures 203 and 205 are switched under control of the SELA and SELB signals. Therefore, the switched capacitors and associated active elements in switched structure 203 will be switched from the positive block 211 down to the negative block 205, with the switched structure 205 in the negative block 213 being switched up to the positive block 211. Note that the switch controls in the blocks 219 and 221 remain associated with the positive block 211 and negative block 213, respectively. Also, the respective feedback capacitors 147 and 149 remain in place. Therefore, both the controls and the memory elements in the form of the capacitors 147 and 149 are maintained intact. However, any perturbations due to the switched structures comprised of both the switched capacitors in the active elements are switched between the two differential legs such that they cancel each other out.

Figure 6C:
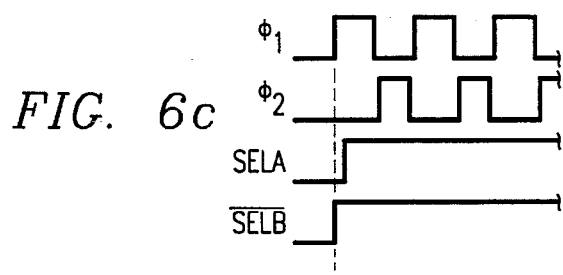

The timing diagram for the operation of switching the switched structures 203 and 205 is illustrated in FIG. 6c. The timing signals for the control signals are illustrated in the two diagrams, it being noted that the timing signal $\phi_1$ has the leading edge thereof lined up with the SELB-Bar signal, wherein the SELA signal is slightly delayed from the leading edge of the SELB-Bar signal. The signals SELA and SELB-Bar are switched at a rate that is approximately equal to 25 periods of the $\phi_1$ signal.

Figure 7:
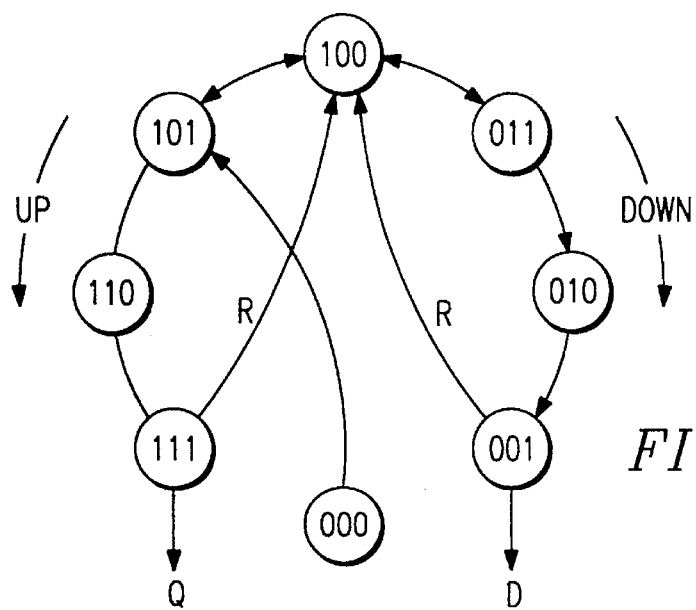
FIG. 7 illustrates a state diagram of the voltage/frequency converter.

Referring now to FIG. 7, there is illustrated a state diagram for the operation of the three-state counter 124. There are effectively eight states represented for all the binary combinations of the three-bit input. Whatever the system is initialized with a "000", the system is reset to the state "101". Whenever a charge count is indicated, the system will count upward for each pulse output by the combination of QUPC and QDNC, indicating a charging operation. Conversely, for each pulse output by the combination of DDPC and DUPC, the count will be decremented. The three states that are input will either cause the states to increase or decrease. When they decrease to a value "001", this results in the D-output outputting a pulse. Whenever the Q-output is generated or the D-output is generated, the states will reset itself back to the state "100". As such, it will require four output pulses from the V/F converter 52 to provide one Q-output or D-output pulse. Therefore, integration control circuit 122 and the counter 124 provide a low pass filter operation on the charge count stream and the discharge count stream. As will be described hereinbelow, these two output streams are utilized to increment and decrement software counters that represent the battery capacity state.

Figure 8:
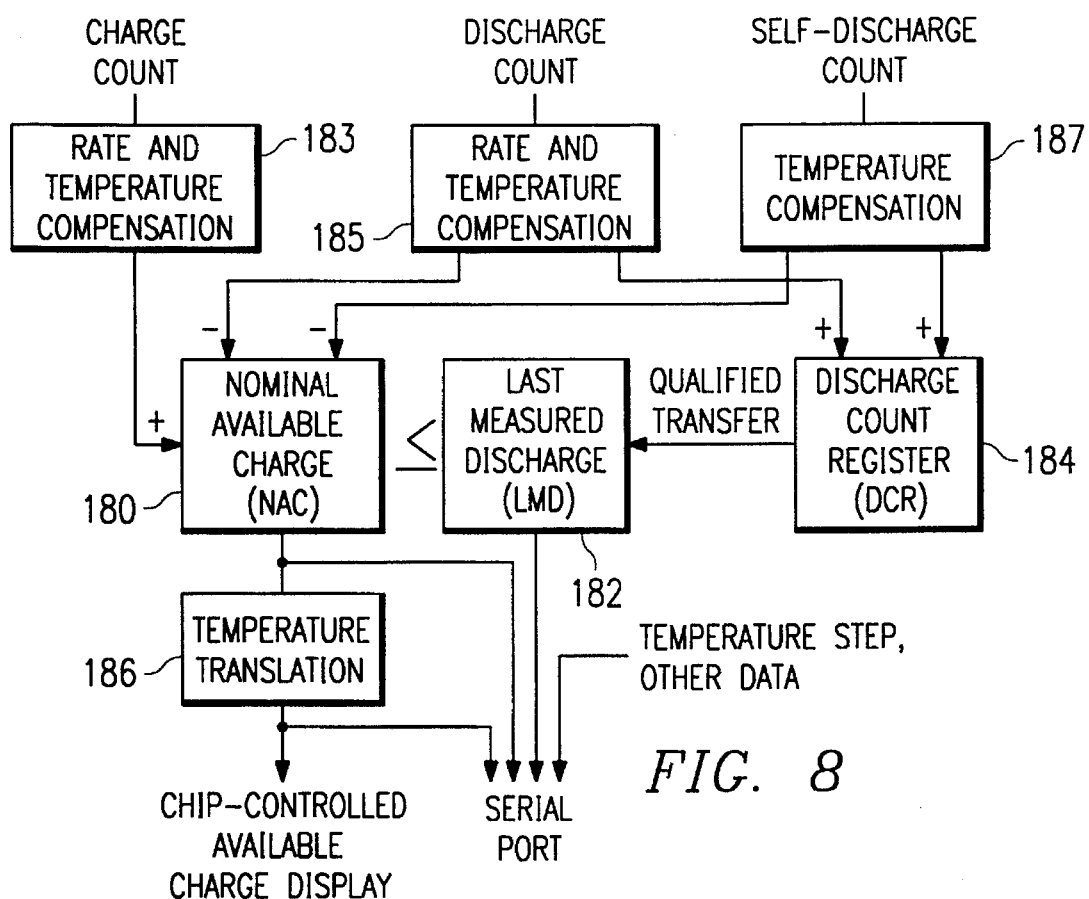
FIG. 8 illustrates an operational overviews diagram of the battery capacity detect circuit.

Referring now to FIG. 8, there is illustrated an operational overview of the battery detect circuit. Three registers are provided, a Nominal Available Charge (NAC) register 180, a Last Measured Discharge (LMD) register 182 and a Discharge Count Register (DCR) 184. The charge count indicated by the Q-output is compensated for both rate and temperature by the V/F converter 52 and is operable to increment the NAC value in the NAC register 180. The discharge count which is rate and temperature compensated is operable to decrement the NAC value. Additionally, the self-discharge count which is temperature compensated is operable to decrement the NAC value. The NAC register 180 provides an indication of the available charge in the battery, as will be described in more detail hereinbelow. The DCR 184 is incremented by the discharge count and by the self-discharge count. The value in the DCR 184 is transferred to the LMD 182 under certain conditions, which is termed a "qualified discharge". These conditions exist whenever there has not been a partial charge since the last full charge, whenever the temperature is greater than 10°, whenever the self-discharge accounts for less than approximately 18% relative to PFC and whenever the battery has been fully discharged by generation of the EDV1 voltage, this indicating that the voltage of the battery has fallen below a predetermined level that indicates a full discharge. The value in the NAC register 180 is always less than or equal to the value in the LMD register 182.

The serial port receives information regarding the value in the NAC register 180, the LMD register 182 and the DCR 184. Further, the output of the NAC register 180 is utilized by the microcontroller 64 to provide the available charge display on the actual battery-pack itself. A temperature translation operation is indicated by a block 186 that provides for an adaptive translation. When the temperature is greater than 10° C., the actual output of the NAC register 180 is provided. When the temperature is between −20° C. and +10° C., the value of the NAC register 180 is decreased by 20% of the full value indicated by the value stored in the LMD register 182. When the temperature is less than −20° C., the value in the NAC register 180 is reduced by 0.5 times the value stored in the LMD register 182, this indicating a full value.

Prior to being input to the NAC, the charge count is processed through a rate and temperature compensation process, indicated by a block 183. Additionally, the discharge count is also processed through a rate and temperature compensation process indicated by block 185. Additionally, the self-discharge count value is also temperature compensated, as indicated by temperature compensated block 187, prior to being input to the DCR 184 or the NAC 180.

The rate and temperature compensation blocks 183 and 185 allow the integrator count to be compensated for both temperature and charge/discharge rate before being entered into the NAC 180 or the DCR 184. The charge and discharge rate compensation values are referenced to a zero compensation for 1C charge and discharge rates. The charge compensation rates are less than 100%. The discharge compensation rates, if enabled by program pins 4 and 5, as described above with reference to Table 2, may be below 100% (>1.0 efficiency) for discharge rates with $V_{SR}<V_{SR1}$ and above 100% (<1.0 efficiency) for higher discharge rates.

A Charge Efficiency Compensation (CEC) value is provided that accounts for both charge rate compensation and charge temperature compensation. The charge rate compensation of the CEC adapts between a fast charge rate and a trickle charge rate at an uncompensated charge rate threshold of 0.15 C to 0.32 C (two counts/ second decision threshold), with the specific threshold depending on the Program Full Count (PFC). Charge counting always initiates at the fast rate compensation. The compensations are 0.95 for a fast charge and 0.85 for a trickle charge. These selections conservatively understate charge being stored during most of the course of charge. In some cases, if a charge is terminated at almost, but not quite full, then the NAC 180 may slightly overstate the available charge. This is because the charging efficiency worsens as the battery approaches full. If a charger carries a battery all the way to full, this overstatement will not occur.

The CEC provides for charge temperature compensation which adapts over three steps between nominal, warm and hot temperatures. If the temperature is above 30° C., the trickle charge will be compensated by a factor of 0.80 and the fast charge will be compensated by a factor of 0.95. For temperatures between 30°–40° C., the trickle charge is compensated by a factor of 0.65 and the fast charge is compensated by a factor of 0.80. For temperatures above 40° C., the trickle charge is compensated by factor of 0.55 and the fast charge is compensated at a value of 0.65. With respect to the above three steps, the approximate temperature factors that are applied are 1.00 for temperatures less than 30° C., 0.85 for temperatures between 30°–40° C. and 0.70 for temperatures greater than 40° C.

A Discharge Efficiency Compensation (DEC) value is provided that may be disabled or enabled through the PROG4 and PROG5 pins as described above with respect to Table 2. If the DEC is disabled, the discharge count will be decremented/incremented using a 1.0 factor. However, if the DEC is enabled, the discharge rate will be compensated at four rates based on three $V_{SR}$ thresholds. $V_{SR}$ thresholds allow the transitions to occur rapidly. There are five fixed compensation rates available (0.95, 1.00, 1.05, 1.15 and 1.25). The $V_{SR}$ threshold voltages after defining the rates may be programmed and stored in the ROM, which four defined rates can then be utilized. In one example, the discharge rate is changed from 0.95 to 1.00 at a threshold voltage of $V_{SR1}=75$ mv. The discharge compensation rate changes from 1.00 to 0.05 at a threshold voltage of $V_{SR2}=150$ mv. The compensation changes from 1.05 to 1.15 at a threshold voltage $V_{SR3}=206$ mv. This is illustrated in Table 3.

TABLE 3

| Discharge Comp. Rate | $V_{SR}$ Threshold | Efficiency |
| --- | --- | --- |
| 0.95 | | 105% |
| 1.00 | $V_{SR1}$ = 75 mv | 100% |
| 1.05 | $V_{SR2}$ = 150 mv | 95% |
| 1.15 | $V_{SR3}$ = 206 mv | 87% |

The DEC value is also operable to provide for adaptive temperature compensation if enabled. At lower temperatures, the compensation will shift to a more severe compensation step, stopping at the most severe of the overall options. For temperatures above 10°, no shift is provided. However, for temperatures between 0°–10°C., the temperature compensation will be shifted by a factor of 0.05, such that, for example, a temperature rate compensation of 0.95 will be shifted to a factor of 1.00, etc. The most severe shift will be for temperatures less than −20° C. which will result in a shift of 0.30. Temperatures between −20° C. and −10° C. result in a shift of 0.20, and temperatures between −10° C. and 0° C. result in a shift of 0.10. These are illustrated in Table 4.

TABLE 4

| Temperature | Shift |
| --- | --- |
| 10° C. < T | No Shift; Nominal Compensation |
| 0° C. < T < 10° C. | Shift 1 (i.e., 0.95 becomes 1.00, etc.) |
| −10° C. < T < 0° C. | Shift 2 (i.e., 0.95 becomes 1.05, etc.) |
| −20° C. < T < −10° C. | Shift 3 (i.e., 0.95 becomes 1.15, etc.) |
| T < −20° C. | Shift 4 (i.e., 0.95 becomes 1.25, etc.) |

The self-discharge rate temperature compensation (SDTC) is programmed to be a nominal rate of 1/61*NAC or 1/30.5*NAC rate per day. This is the count rate for a battery within the 20°–30° C. temperature step. This count rate adapts across the eight steps from 0°–10° C. to a value greater than 80° C., doubling with each higher step, which step comprises 10° C. increments. The SDTC is illustrated in Table 5.

TABLE 5

| Temp. Step | Factor of Nominal Rate | Temp. Step | Factor of Nominal Rate |
|---|---|---|---|
| <10° C. | 0.25x | 40° C.–50° C. | 4x |
| 10° C.–20° C. | 0.50x | 50° C.–60° C. | 8x |
| 20° C.–30° C. | 1x | 60° C.–70° C. | 16x |
| 30° C.–40° C. | 2x | >80° C. | 32x |

Figure 9A:
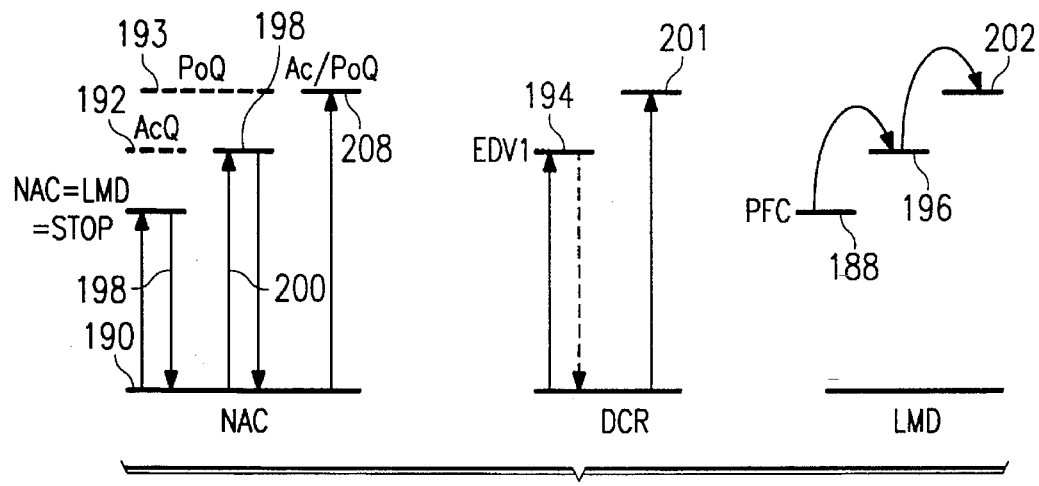
FIGS. 9a–9c illustrate diagrammatic views of the register operation for the nominal available charge register, the discharge count register and the last measured discharge register.
Figure 9B:
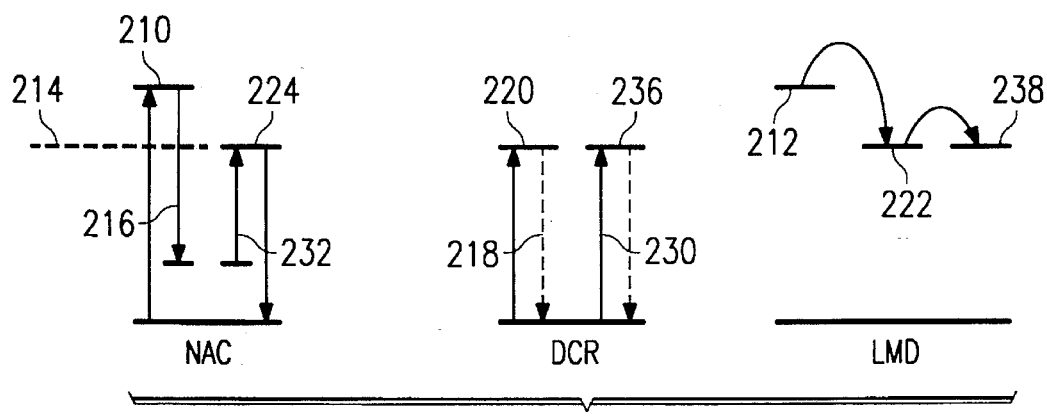
Figure 9C:
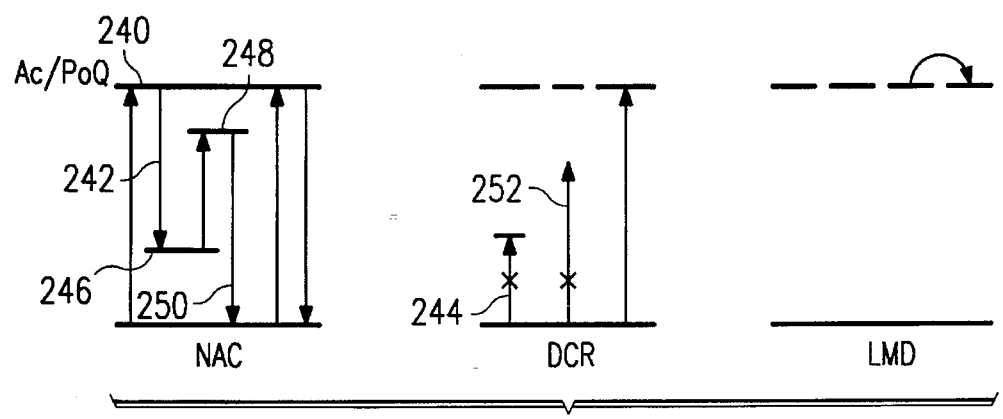

Referring now to FIGS. 9a–9c, there are illustrated diagrammatic views of the operation of the NAC register 180, LMD register 182 and DCR 184. With specific reference to FIG. 9a, there is illustrated a situation wherein the NAC register counts up to a count value equal to the LMD value, which is initially set to the Program Full Count (PFC) value, as indicated by a level 188. This level 188 essentially represents a count value, but, for illustrative purposes, it is represented as a level. Initially, the NAC operates from a zero value, represented by a point 190, the point 190 existing on a baseline. During a charge operation, the value in the NAC register 180 will increase up to a count value equal to the count stored in the LMD register 182 and will not exceed that level, even if the battery continues to charge. In the example in FIG. 9a, the battery does continue to charge to a level 192, representing the actual Q stored in the battery. Therefore, if the condition had not existed wherein the NAC value was limited by the LMD value, the count value in the NAC register 180 would have increased to the level 192. This example represents in the first process step a step whereby the battery was not fully charged on the first charge. Therefore, a potential Q level 193 exists to represent the potential Q of the battery, i.e., the value at which the NAC would reside if it represented the full Q of a fully charged battery.

In the next cycle, when the battery is discharged, the DCR 184 increases in value until it reaches a level 194. At the level 194, the battery has been discharged below the threshold voltage EDV1, which is the first End of Discharge Voltage threshold, which is approximately 1.05 volts for nickel chemistry. This represents a qualified transfer condition such that the value stored in the DCR 184 will now be transferred to the LMD register 182, raising the value in the LMD register 182 to a count level indicated by a level 196. Of course, during this time, the value stored in the NAC register 180 decreases, as indicated by a discharge count line 198. Therefore, the nominal available charge indicated by the NAC value in the register 180 is decremented. However, as will be described hereinbelow, this value at this point in the procedure is not accurate, nor is the value stored in the LMD register 182 accurate. The reason is that the actual Q represented by the line 192 is less than the potential Q represented by the line 193. As such, when the DCR 184 was incremented, it did not represent a discharge from a full charge level. During the second charge cycle, represented by the line 200, the charge represents a full charge. Therefore, the actual Q and the potential Q are both disposed at the line 193, even though the NAC value was limited by the value stored in the LMD register 182, represented by line 196.

In the next discharge operation, the DCR value in register 184 will increase in value from the base line to a fully-discharged value at a level 201. The DCR value in register 184 will increase in value from the base line to a fully discharged value at a level 201. The DCR value in register 184 was changed from the level 194 back to the base line in a reset operation, which reset operation can occur any time during the increase in the NAC value. When the value in the DCR register 184 reaches the fully discharged value 201, indicated by the voltage falling below the EDV1 value, a qualified transfer occurs and the count value stored in the LMD register 182 increases to a value represented by a level 202.

During the next charge operation, the NAC value goes from the base line to a level 208 that represents both the potential Q and the actual Q, thus providing an NAC value that is a valid. Therefore, it can be seen that the only information required by the battery capacity detect circuit is the amount of charge removed from the battery when discharging from a fully charged value to a fully discharged value followed by incrementing of a charge counter during a charge operation. This charge counter represents the actual charge in the battery, which charge level can be represented as a percentage of full. As such, if the overall capacity of the battery decreases, the level to which the NAC value can increase will be limited.

Referring now to FIG. 9b, there is illustrated an example wherein the battery capacity decreases for some reason over time and the value stored in LMD must also decrease. Initially, the NAC value has an initial value that is in error relative to the battery capacity, such that when it increases to a level 210, corresponding to an LMD level 212, it represents a value that is greater than the potential Q of the battery, which is indicated by a dotted line 214. On the first discharge operation thereafter, the NAC value will be decremented, as indicated by a downward count line 216 for the NAC value and an upward count value line 218 for the DCR 184. The DCR value will rise to a value 220, which indicates a full discharge. Since it is a full discharge, this will result in a qualified transfer, thereby decreasing the value stored in the LMD register 182 to a value 222. During this charge operation, the NAC value did not decrease to the previous baseline level, but to a higher level.

During the next charge operation, the NAC value will increase to a level 224, which represents the level stored in the LMD register 182, corresponding to level 222. NAC will not increment further. When the battery is fully charged, this does represent an accurate NAC value and, thereafter, the NAC value will represent the actual charge stored in the battery.

During the next discharge operation, as represented by an increasing count value arrow 230, NAC will decrease, as indicated by a down counting arrow 232, until the DCR value rises to a level 236, corresponding to the level 220. Again, this is a qualified transfer condition and this value will be transferred to the LMD register 182, as represented by a level 238. Of course, the LMD value has not changed since the battery condition has not changed. This will continue until some parameter of the battery has changed.

Referring now to FIG. 9c, there is illustrated a condition wherein the battery is not fully discharged. In the initial operation, the NAC value is incremented from the base line to a level 240, representing both the actual and the potential Q of the battery, i.e., this is a valid, fully charged level. On the next operation, as indicated by down counting arrow 242, the battery is partially discharged. The DCR value increases during this time, but not to a full level since a full discharge has not occurred and, as such, this does not correspond to a qualified transfer, this count value being indicated by an arrow 244 with an x through it. During the next operation, the NAC value is initiated from a level 246, which is greater than the base line, and increases to a level 248, which is less than the fully charged level at level 240. During the next operation, the battery is fully discharged, as indicated by a down count arrow 250 on the NAC register 180 and an increasing count arrow 252 on the DCR 184. However, even though the battery is fully discharged, a qualified transfer does not occur, since the previous cycle of the NAC did not represent a fully charged level. The next cycle represents the condition wherein NAC rises to a level equal to LMD and is then fully discharged. This will result in the DCR value of register 184 increasing to a fully discharged level after a fully charged level and allowing a qualified transfer. Therefore, the conditions for a qualified transfer in the illustrations of FIGS. 9a–9c require that a charge occur to what appears to be a fully charged level, as represented by the value in the LMD register 182, followed by a full discharge operation to adjust the value of the LMD register.

Figure 10:
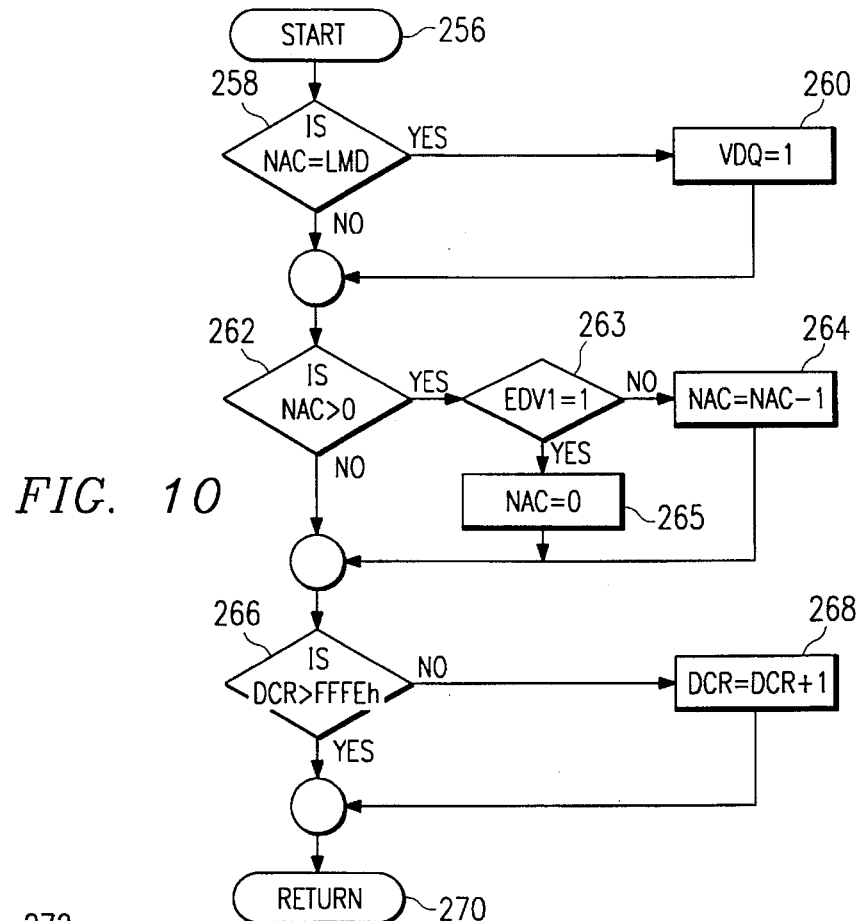
FIG. 10 illustrates a flowchart for the discharge count routine.

Referring now to FIG. 10, there is illustrated a flowchart for the discharge count routine. The flowchart is initiated at a start block 256 and then proceeds to a decision block 258 to determine if the NAC value is equal to the LMD value. If so, a flag VDQ is set, as indicated by a block 260, and then the program flows to a decision block 262. If the NAC value is not equal to the LMD value, the program also flows from decision block 258 to a decision block 262. Decision block 262 determines whether NAC is greater than zero. If so, the program flows to a decision block 263 to determine if EDV1 flag is equal to "1" and, if not, the program flows to a block 264 to decrement the NAC value. The output of block 264 flows to the input of a decision block 266. If EDV1 flag is equal to "1", the program flows from the decision block 263 to a function block to set NAC equal to "0" and then to decision block 266. If the NAC value is not greater than zero, the program flows from decision block 262 to the input of decision block 266. Decision block 266 determines whether the DCR value is greater than a predetermined value "FFFEh" to determine if an overflow condition exists. If it is not greater than the predetermined value, the program flows to a block 268 to increment the DCR value, and if it is greater than the predetermined value, the program flows from the decision block 266 to a return block 270, the output of block 268 also flowing to the return block 270. Therefore, the value in the DCR 184 is not allowed to exceed the value "FFFFh".

Figure 11:
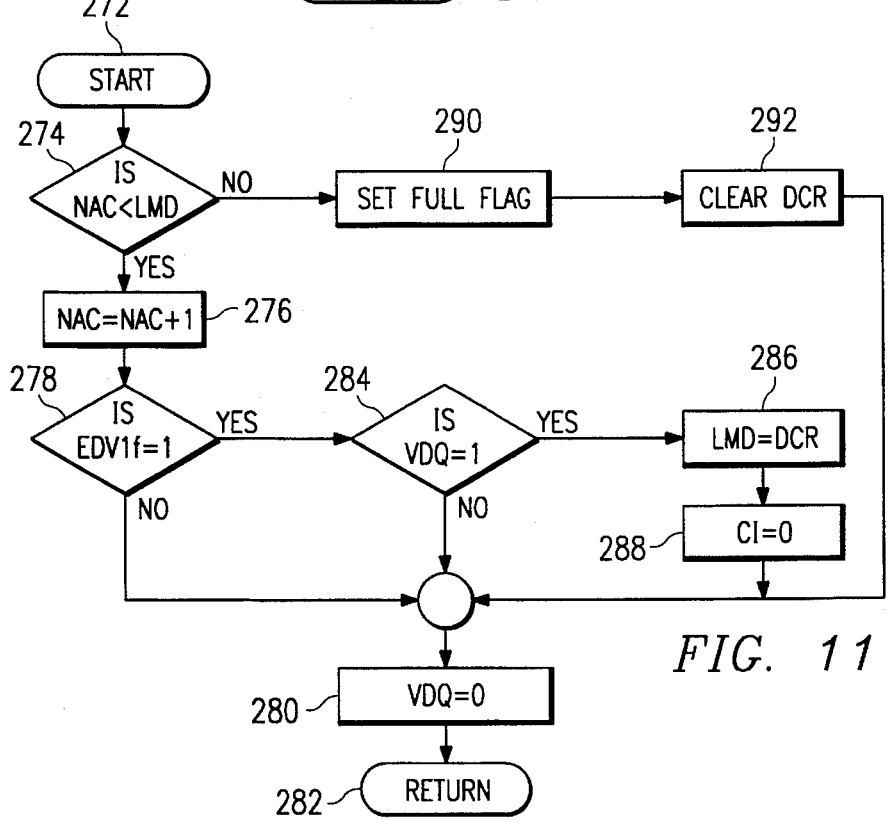
FIG. 11 illustrates a flowchart for the charge count routine.

Referring now to FIG. 11, there is illustrated a flowchart depicting the charge count routine. The program is initiated at a start block 272, then proceeds to a decision block 274 to determine whether the NAC value is less than the LMD value. If the NAC value is less than the LMD value, the program flows from the decision block 274 to a block 276 to increment the NAC value and then to a decision block 278 to determine whether the End of Discharge Voltage Flag (EDV1F) is equal to one. If it is not, this indicates a not empty condition, and the program flows to a block 280 to set the VDQ flag equal to zero and then to a return block 282. However, if the EDV1 flag is set to one, the program flows to a decision block 284 to determine whether the VDQ flag is set to one. If the VDQ flag is set, the program flows to a block 286 to set the LMD value equal to the DCR value and then to a block 288 to set the capacity inaccurate (CI) flag equal to zero, and then to the input of block 282, to set the VDQ flag equal to zero. If the VDQ flag is not set in decision block 284, the program would see this as an invalid discharge and would flow to the determine block 282 to again wait for another count.

If, during the initial count, the decision block 274 had indicated that the value of NAC was not less than LMD, i.e., was equal to or greater, the program would flow to a block 290 to set the "full" flag and then to a block 292 to clear the DCR 184 to a reset state, and then to the return block 282. Therefore, it can be seen that the LMD value is set equal to the DCR value whenever the EDV1 flag is set and the VDQ flag is set, indicating an End of Discharge Voltage condition wherein the charge operation was initiated at a point wherein the NAC value was equal to the LMD value and continued to a fully discharged state and that both temperature and self-discharge qualifications were met. Therefore, for the first pass through the flowchart of FIG. 11, the flowchart will increment the NAC value and flow through block 276 with VDQ being set equal to zero. This will continue until the value of NAC is equal to LMD, at which time the full flag will be set and the program will flow through the block 282. However, after a fully discharged operation, the program will increment the NAC value and also do a justified LMD transfer.

Figure 12:
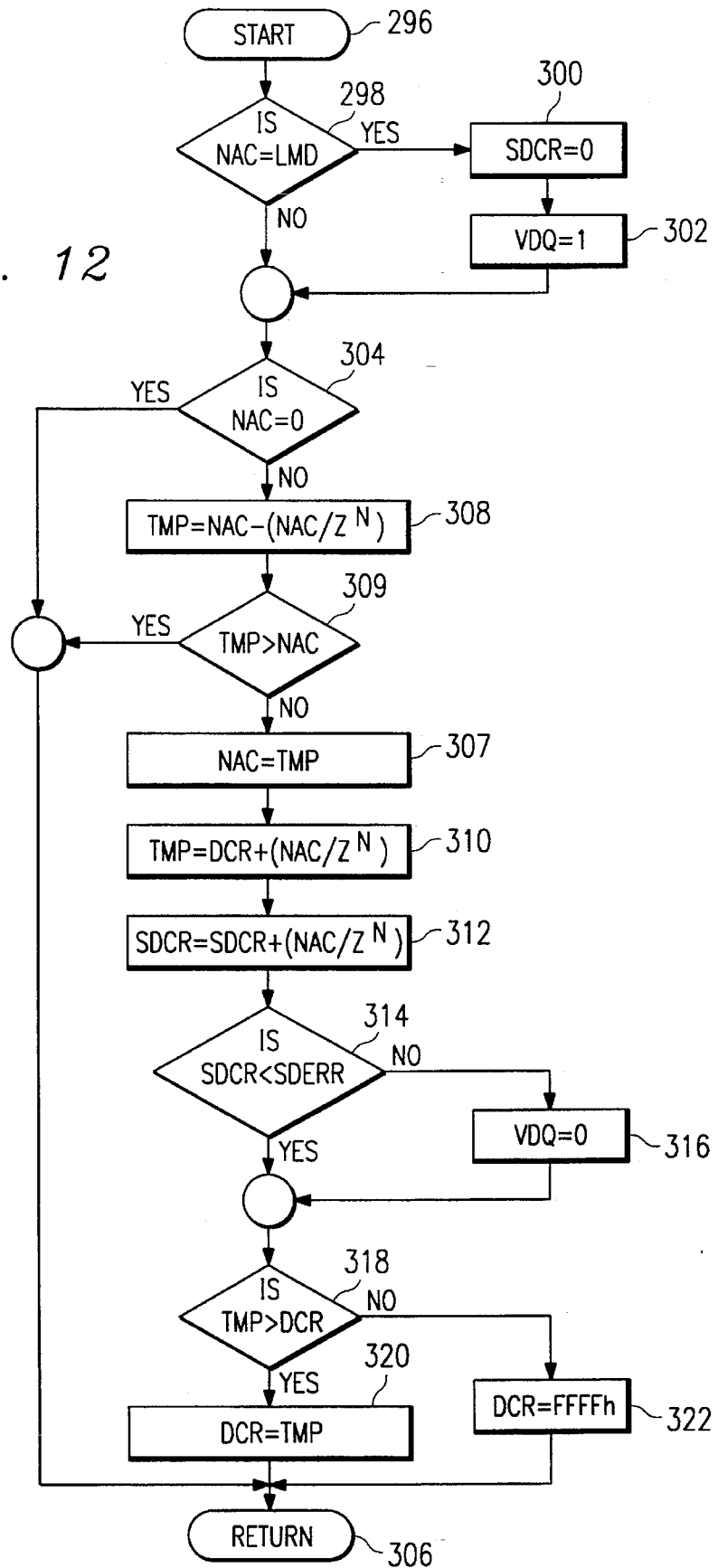
FIG. 12 illustrates a flowchart for the self-discharge count routine.

Referring now to FIG. 12, there is illustrated a flowchart depicting the operation of a self-discharge count routine. The program is initiated at a start block 296 by a timer interrupt and then proceeds to a decision block 298 to determine if the NAC value is equal to the LMD value. If so, the Self Discharge Count Register (SDCR) value is set to zero in a block 300 and the VDQ flag is set to one in a block 302. If the NAC value is not equal to the LMD value, the program will flow to the input of a decision block 304, the program also flowing from the block 302 to the input of the decision block 304. The decision block 304 determines whether the NAC value is equal to zero. If it is equal to zero, the program flows to a return block 306. If it is not equal to zero, the program flows to a block 308, to set the TMP value equal to the NAC value decremented by a factor of $NAC/2^N$. The program then flows to a decision block 309 to determine if TMP is greater than NAC and, if so, the program flows to return block 306, this being an underflow condition. If TMP is less than NAC, then the program flows to a function block 307 to set NAC equal to TMP. The program then flows to a function block 310 to generate a TMP value, which represents the DCR value incremented by $NAC/2^N$. The SDCR value is incremented by $NAC/2^N$ in a block 312. The program then flows to a decision block 314 to determine whether the value in the self-discharge count register (SDCR) is less than the self-discharge error (SDERR). In the preferred embodiment, SDERR is represented by the value 4096 in a 16-bit register. If the SDCR value is not less than the SDERR value, the program flows to a block 316 to set the VDQ flag to zero, as indicated by a block 316. This qualifies that the DCR is no longer a valid indicator of LMD. The program then flows to the input of a decision block 318. If, however, the value of SDCR is less than SDERR, the program also flows to the input of decision block 318.

Decision block 318 determines whether the value stored in the temporary register TMP is greater than the DCR value, this providing a check for overflow. If no overflow condition is present, the program flows along a "Y" path to a block 320 to set the value of DCR equal to TMP. If an overflow condition exists, the program flows to a function block 322 to set the DCR value to a full value. The program flows from blocks 320 and 322 to the return block 306.

Referring now to FIG. 13, there is illustrated a flowchart for the interrupt handler. The program is initiated at a start block 324 and then flows to a decision block 326 to determine whether a charge interrupt has been generated. If so, the charge count routine is initiated, as indicated by block 328. After the charge count routine has been executed, the program flows to a block 330, wherein the display is updated and then to a block 332 to enable the interrupt and then to a return block 334.

If the interrupt is not a charge interrupt, the program flows to a decision block 336 to determine whether the interrupt is a discharge interrupt. If it is a discharge interrupt, the program flows to a block 338 to initiate the discharge count routine and then to the block 330. If the interrupt is not a discharge interrupt, the program flows to a decision block 340 to determine whether the interrupt is a timer interrupt, this indicating the self-discharge timer output from counter 88. If it is a timer interrupt, the program flows to a block 342 to increment the time by one and to a decision block 344 to determine whether the timer count is greater than SD. The SD value represents a variable that is exponentially related to temperature and is derived from the output of the comparator 84 during the determination of the TEMP input to multiplexer 86. This allows the self-discharge rate to be temperature compensated. If so, the program flows to a block 346 to initiate the self-discharge count routine. If not, the program flows to the update display block 330. After the self-discharge count routine has been completed, the program flows to the update display routine 330. Also, if the interrupt is not a timer interrupt, the program would also flow from the decision block 340 to the update display block 330.

Referring now to FIG. 14, there is illustrated the condition wherein the battery 10 is subjected to a high load or a fast-discharge condition. Initially, the current starts out at a relatively low level of current with the battery voltage disposed at $V_{BAT}$. At a time corresponding to a point 350, the battery is subjected to a high current load. The battery voltage drops due to the internal resistance thereof to a level at a point 352 that is substantially below the voltage $V_{BAT}$. Upon removal of the high current load at a point 354, the current falls to zero and the battery voltage then goes back up. However, at this point, the battery drain is negligible and the voltage on the battery goes above $V_{BAT}$, since there is no load thereon. The FET 59 is activated, disposing the resistors 61 across the battery 10. This places a load on the battery 10 and causes the voltage to again decrease to $V_{BAT}$, which may be lower than the previous $V_{BAT}$, under no load. This occurs at a point 356.

Since the End of Discharge Voltage (EDV) monitoring requires a reliable battery voltage, some accommodation must be made for situations wherein fast discharge rates are encountered. In the present system, this is accommodated by monitoring the voltage $V_{SR}$ across the sense resistor relative to a predetermined threshold $V_{SAX}$. The empty pin goes active when the voltage goes from a level above the threshold $V_R$ to a level below the voltage $V_{SAX}$, this active voltage being present for approximately four seconds. The FET 59 then connects the resistor 61 across the battery 10. This results in approximately 20–100 mA drain on the battery. After a short stabilization period to allow the battery voltage to recover from the heavy application load, i.e., when $V_{SR}>V_{SAX}$, EDV monitoring is resumed. This is done since the voltage $V_{BAT}$ during high current or high discharge rates is not a valid indicator of charge state.

Although the preferred embodiment has been described in detail, it should be understood that various changes, substitutions and alterations can be made therein without departing from the spirit and scope of the invention as defined by the appended claims.

What is claimed is:

1. A battery monitoring circuit for monitoring current with a current monitor through a sense resistor disposed in series with one terminal of the battery by detecting the voltage across the sense resistor in order to determine the current through the battery terminal, the current monitor comprising:

a voltage-to-frequency converter for converting the voltage across the sense resistor to a primary pulse stream, the rate of said primary pulse stream corresponding to the voltage across the sense resistor;

a circuit for determining the current through the battery terminal, the current being a function of the rate of said primary pulse stream; and said voltage-to-frequency converter having a differential structure associated therewith, said differential structure comprising:

a first differential leg having first passive switching elements and first active elements associated therewith for receiving as an input voltage the voltage that is across the sense resistor and processing the input voltage therethrough with said first passive switching elements and said first active elements in a first predetermined manner and outputting a first differential signal, a second differential leg substantially identical to said first differential leg and having second passive switching elements and second active elements associated therewith for receiving as an input voltage the voltage across the sense resistor and processing the input voltage therethrough with said second passive switching elements and said second active elements in a second predetermined manner and outputting a second differential signal, said second differential signal being substantially similar to said first differential signal and of an opposite polarity with differences between said first and second differential signals resulting from differences between said first and second passive switching elements and said first and second active elements in said first and second differential legs, respectively, wherein positive transitions in said first differential signal will correspond to negative transitions in said second differential signal, such that said first and second differential signals comprise a differential output, a multiplex circuit for periodically switching select portions of said first and second passive switching elements and said first and second active elements between said first and second differential legs to compensate for said differences between said first and second passive switching elements and said first and second active elements in said first and second differential legs, and a pulse generation system for generating a first differential pulse stream having a pulse rate that is a function of said first differential signal and a second differential pulse stream having a pulse rate that is a function of said second differential signal and a summing circuit for summing said first and second differential pulse streams to provide said primary pulse stream.

2. The monitoring circuit of claim 1, wherein:

each of said first and second differential legs having associated therewith first and second switched capacitor integrators, respectively, that each provide an integrated voltage on the output of the respective one of said first and second switched capacitor integrators that is a function of the input voltage input thereto, the input voltage applied thereto being the voltage across the sense resistor;

said first switched capacitor integrator having a first integrator feedback capacitor associated therewith that comprises a portion of said first passive switching elements and first switched control signals;

said second switched capacitor integrator having a second integrator feedback capacitor associated therewith that comprises a portion of said second passive switching elements and second switched control signals;

a first switchable amplifier with an associated switched capacitor input structure which, when said first switchable amplifier has said first or second integrator feedback capacitor connected between the input and output thereof and said associated switched capacitor input structure controlled by said first or second switched control signals, will form said first or second switched capacitor integrator;

a second switchable amplifier with an associated switched capacitor input structure which, when said second switchable amplifier has said first or second integrator feedback capacitor connected between the input and output thereof and said associated switched capacitor structure controlled by said first or second switched control signals, will form said first or second switched capacitor integrator;

said first switchable amplifier comprising the select portion of said first active elements and said second switchable amplifier comprising the select portion of said second active elements and said associated switched capacitor input structures comprising the select portion of said first and second passive switching elements; and said multiplex circuit operable to alternately switch said first and second switchable amplifiers between said first and second differential legs and said first and second integrator feedback capacitors.

* * * * *